United States Patent
Kaneko et al.

(10) Patent No.: US 10,109,463 B2
(45) Date of Patent: Oct. 23, 2018

(54) MICROWAVE AUTOMATIC MATCHER AND PLASMA PROCESSING APPARATUS

(71) Applicant: TOKYO ELECTRON LIMITED, Tokyo (JP)

(72) Inventors: Kazushi Kaneko, Miyagi (JP); Hideo Kato, Miyagi (JP); Kazunori Funazaki, Miyagi (JP); Yuji Otsuka, Miyagi (JP); Shinji Kawada, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 339 days.

(21) Appl. No.: 15/064,698

(22) Filed: Mar. 9, 2016

(65) Prior Publication Data

US 2016/0268101 A1 Sep. 15, 2016

(30) Foreign Application Priority Data

Mar. 12, 2015 (JP) .................. 2015-049198

(51) Int. Cl.
*H01J 37/32* (2006.01)

(52) U.S. Cl.
CPC ... *H01J 37/32311* (2013.01); *H01J 37/32229* (2013.01); *H01J 37/32917* (2013.01)

(58) Field of Classification Search
CPC .......... H01J 37/32082; H01J 37/32183; H01J 37/32091; H01J 37/321; H01J 37/3211; H01J 37/32192; H01J 37/32211; H01J 37/32229; H01J 37/32311; H01J 37/3299; H05H 1/46; H05H 2001/4607; H05H 2001/4615; H05H 2001/4622; H05H 2001/463; H05H 2001/4682
See application file for complete search history.

(56) References Cited

U.S. PATENT DOCUMENTS

| 5,041,803 A | 8/1991 | Shinohara et al. |
| 6,792,889 B2 * | 9/2004 | Nakano ............ H01J 37/32082 118/723 E |
| 9,072,158 B2 * | 6/2015 | Ikeda ................ H01J 37/32192 |
| 9,418,822 B2 * | 8/2016 | Kaneko ............ H01J 37/32935 |

FOREIGN PATENT DOCUMENTS

| JP | 2-249301 A | 10/1990 |
| JP | 2001-251107 A | 9/2001 |

* cited by examiner

*Primary Examiner* — Haissa Philogene
(74) *Attorney, Agent, or Firm* — Rothwell, Figg, Ernst & Manbeck, P.C.

(57) ABSTRACT

A microwave automatic matcher includes a movable body, a driving unit, a matching control unit, a reflection coefficient measuring unit, and a setting unit. The matching control unit consecutively moves the movable body from a start position in one direction by a distance of a difference between the start position and the target position in a matching operation carried out for the plasma process and then variably controls the position of the movable body until the measurement of the reflection coefficient obtained by the reflection coefficient measuring unit falls within the first neighboring range by monitoring the measurement of the reflection coefficient.

18 Claims, 21 Drawing Sheets

FIG.4

| PRESET No. | 0 | 1 | 2 | ..... |
|---|---|---|---|---|
| OFF PRESET ENABLE/DISABLE | En | En | En | ..... |
| OFF PRESET POSITIONS | 0,0 | 10,-10 | -20,-30 | ..... |
| OFF PRESET TIMER | 0.0 | 0.2 | 1.2 | ..... |
| ON PRESET ENABLE/DISABLE | Di | Di | En | ..... |
| ON PRESET POSITIONS | | | 10,10 | ..... |
| ON PRESET TIMER | | | 0 | ..... |
| $\Gamma in\ (|\Gamma in|, \Theta in)$ | 0.000,0 | 0.050,0 | 0.050,0 | ..... |
| $\Gamma th$ | 0.02 | 0.02 | 0.025 | ..... |
| $\Gamma h$ | 0.04 | 0.04 | 0.050 | ..... |
| MOTOR SPEED | 10 | 10 | 10 | ..... | ered interval in the traveling direction of the microwave, and a movable short-circuit body referred to as a movable short-circuit plate or a short plunger or the like is provided in each branch waveguide so as to be movable in an axial direction of the waveguide. A controller of the E tuner controls the characteristic impedance of the waveguide by variably controlling the position of the movable short-circuit body in the branch waveguide by controlling a driving of the motor based on an output signal of the probe type sensor described above, and further matches the impedance of the load side with the impedance of the microwave generator.

MICROWAVE AUTOMATIC MATCHER AND PLASMA PROCESSING APPARATUS

CROSS-REFERENCE TO RELATED APPLICATIONS

This application claims priority to Japanese Patent Application No. 2015-049198 filed on Mar. 12, 2015, the entire contents of which are incorporated herein by reference.

FIELD OF THE INVENTION

The disclosure relates to a microwave discharge type plasma processing apparatus and a microwave automatic matcher for use in the same.

BACKGROUND OF THE INVENTION

In plasma process for manufacturing a semiconductor device, a liquid crystal display or the like, a high frequency in a MHz band or microwave in a GHz band is used to discharge a process gas in a vacuum process chamber. A microwave discharge type plasma processing apparatus is advantageous in that a plasma having a high density and a low electron temperature can be generated at a low pressure and also in that a configuration of the plasma processing apparatus can be simplified because a magnetic field is not required and a large-diameter plasma can be effectively generated in a wide pressure range by employing a flat plate type microwave introducing window structure.

Generally, in the microwave discharge type plasma processing apparatus, a microwave generator for supplying microwave into a process chamber is provided at a location separated from the process chamber, and an antenna having microwave radiation slots is provided above the microwave introducing window (dielectric window) of the process chamber. Further, the microwave is transmitted from the microwave generator to the antenna through a microwave transmission line. This microwave transmission line is typically configured to transmit the microwave outputted from the microwave generator to a mode transducer in a TE mode or a TM mode through a waveguide and then transmit the microwave that has been converted to a TEM mode by the mode transducer to the antenna through a coaxial waveguide.

In the microwave discharge type plasma processing apparatus, in order to effectively supply a power of the microwave to a load (mainly the plasma), it is required to match an impedance of a load side with an impedance of a microwave generator on the microwave transmission line. Generally, an automatic matcher is attached to the waveguide. Conventionally, a stub tuner, an E tuner, and an EH tuner are well known as the automatic matcher.

In the stub tuner, a plurality of stub rods are arranged at a regular interval in a travelling direction of the microwave and a probe type sensor is disposed at a position closer to the microwave generator than the stub rods to detect a standing wave (travelling wave and reflection wave) of the microwave in the waveguide. The stub rods are movably inserted into a rectangular waveguide from one side surface thereof. A controller of the stub tuner variably controls insertion lengths of the stub rods by controlling a driving of a motor while using an output signal of the sensor as a feedback signal. Accordingly, a characteristic impedance of the waveguide is controlled and, further, the impedance of the load side is matched with the impedance of the microwave generator.

In the E tuner, a plurality of branch waveguides connected to one side surface (E-plane) of a rectangular waveguide are arranged at a regular interval in the traveling direction of the microwave, and a movable short-circuit body referred to as a movable short-circuit plate or a short plunger or the like is provided in each branch waveguide so as to be movable in an axial direction of the waveguide. A controller of the E tuner controls the characteristic impedance of the waveguide by variably controlling the position of the movable short-circuit body in the branch waveguide by controlling a driving of the motor based on an output signal of the probe type sensor described above, and further matches the impedance of the load side with the impedance of the microwave generator.

In the EH tuner, two branch waveguides are connected to an E-plane and an H-plane of the rectangular waveguide and a movable short-circuit body is provided in each branch waveguide so as to be movable in an axial direction of the waveguide, as in the case of the E tuner. A controller of the EH tuner controls the characteristic impedance of the waveguide by variably controlling the position of the movable short-circuit body in the branch waveguide by controlling a driving of the motor based on an output signal of the probe type sensor described above, and further matches the impedance of the load side with the impedance of the microwave generator side (see, e.g., Japanese Patent Application Publication Nos. H2-249301 and 2001-251107).

In the microwave discharge type plasma processing apparatus, when the microwave transmitted from the microwave generator to the antenna through the microwave transmission line is radiated to a plasma generating space in the process chamber through the dielectric window, a gas near an electric field (microwave electric field) of the surface wave transmitted in a radial direction along an inner surface of the dielectric window is discharged. As a result, a plasma having a high density and a low electron temperature is generated.

In the surface wave plasma, a wave number of a standing wave generated on a boundary surface of the dielectric window has a discontinuous value determined by a boundary condition, so that the electron density of the plasma has a discontinuous value or mode. In accordance with another viewpoint, the electron density of the plasma is not definitively determined with respect to an incident power of the microwave and may have a plurality of values or modes. These modes include a stable mode with a small amount of reflection and an unstable mode with a large amount of reflection. Therefore, even if the incident power is increased or decreased, the electron density of the plasma is not necessarily changed in direct proportion to the increase/decrease of the incident power and rather tends to circulate a plurality of modes to repeatedly occur a mode jump while forming a hysteresis curve. If such a mode jump occurs repeatedly, a reflection wave power is generated and the electron density is abruptly changed. As a consequence, there occurs a phenomenon a so-called hunting that the plasma emission becomes intense or weak repeatedly.

In the conventional microwave plasma processing apparatus, the automatic matcher attached to the microwave transmission line (waveguide) does not have a function of effectively preventing the hunting of the plasma emission. Therefore, it is required to prevent stability, reproducibility, and quality of the plasma process from being deteriorated by the hunting.

SUMMARY OF THE INVENTION

In view of the above, the disclosure provides a plasma processing apparatus and a microwave automatic matcher capable of improving a matching function to enhance stability of a plasma generated by a microwave discharge.

In accordance with an aspect, there is provided a microwave automatic matcher attached to a waveguide which constitutes at least a part of a microwave transmission line connecting a microwave generator with a microwave discharge type plasma processing apparatus. The microwave automatic matcher includes: a movable body configured to be movable in the waveguide or in a branch waveguide connected to the waveguide; a driving unit configured to move the movable body within a specific range; a matching control unit configured to control a position of the movable body by using the driving unit to perform an impedance matching between the microwave generator and a load; a reflection coefficient measuring unit configured to obtain a measurement of a reflection coefficient by detecting a standing wave of microwave propagating through the waveguide at a position closer to the microwave generator than the movable body; and a setting unit configured, with respect to a plasma process, to set a target value of the reflection coefficient and a first neighboring range surrounding the target value of the reflection coefficient and set a position of the movable body which corresponds to the target value of the reflection coefficient as a target position. The matching control unit consecutively moves the movable body from a start position in one direction by a distance of a difference between the start position and the target position in a matching operation carried out for the plasma process and then variably controls the position of the movable body until the measurement of the reflection coefficient obtained by the reflection coefficient measuring unit falls within the first neighboring range by monitoring the measurement of the reflection coefficient.

In accordance with another aspect, there is provided a plasma processing apparatus including: an evacuable process chamber including a dielectric window; a stage configured to support a target object to be processed in the process chamber; a process gas supply unit configured to supply a predetermined process gas into the process chamber; an antenna, having a single slot or a plurality of slots for radiating microwave for plasma generation into the process chamber, provided above the dielectric window; a microwave generator configured to generate the microwave; a microwave transmission line configured to transmit the microwave generated by the microwave generator to the antenna; a waveguide which constitutes at least a part of the microwave transmission line; and the microwave automatic matcher described above, which is attached to the waveguide.

BRIEF DESCRIPTION OF THE DRAWINGS

The objects and features of the disclosure will become apparent from the following description of embodiments, given in conjunction with the accompanying drawings, in which:

FIG. 4 shows an example of parameter information set by a setting unit of the microwave automatic matcher;

DETAILED DESCRIPTION OF THE EMBODIMENTS

Hereinafter, embodiments will be described with reference to the accompanying drawings.

<Overall Configuration of Plasma Processing Apparatus>

Figure 1:
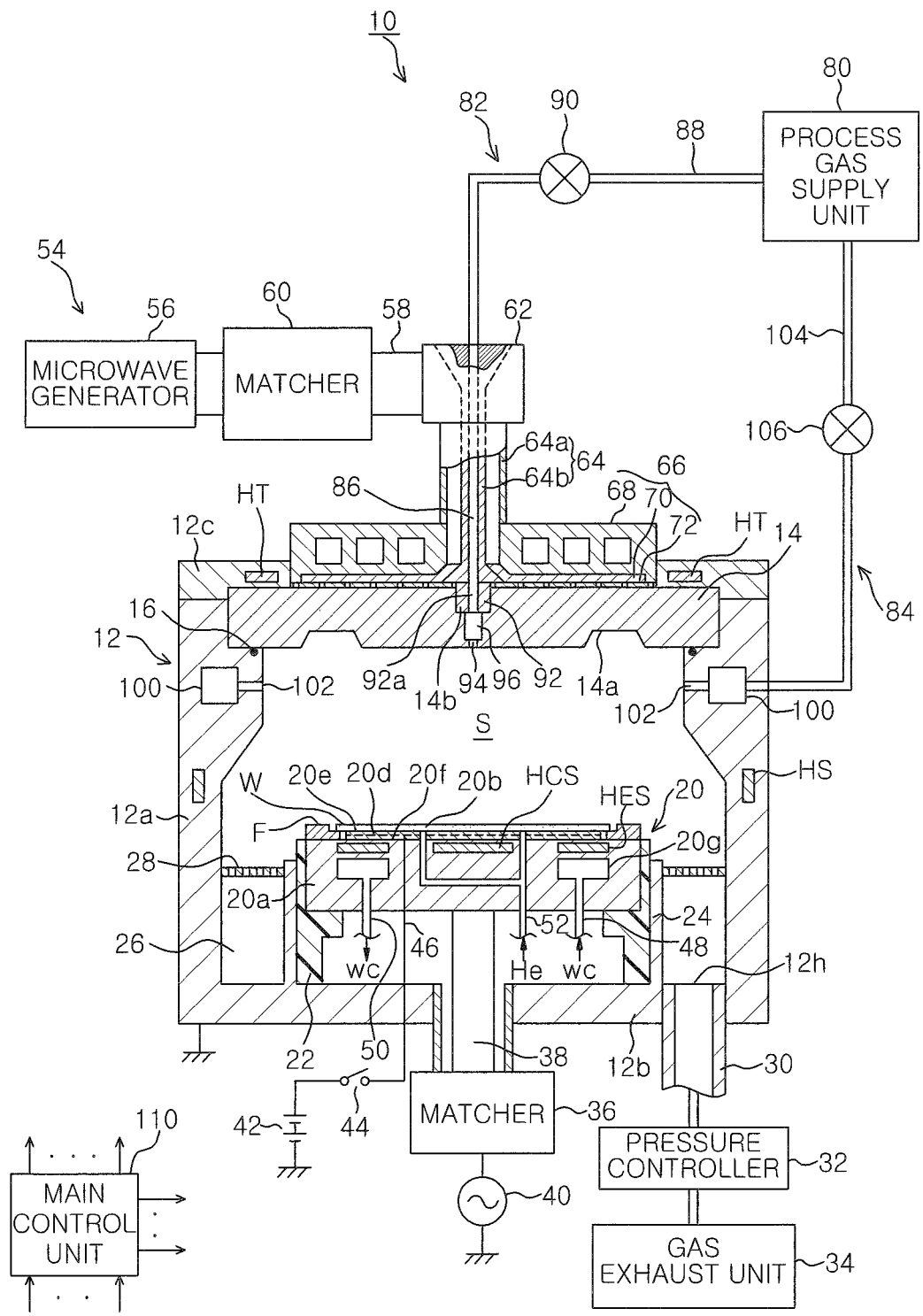
FIG. 1 is a vertical cross section showing a configuration of a plasma processing apparatus including a microwave automatic matcher according to an embodiment.

FIG. 1 shows a configuration of a plasma processing apparatus according to an embodiment. A plasma processing apparatus 10 is configured to perform a required plasma process, e.g., plasma etching, plasma CVD, plasma ALD or the like, by using surface wave plasma excited by microwave and a slot antenna plate. The plasma processing apparatus 10 includes a cylindrical vacuum chamber (process chamber) 12 made of a metal such as aluminum, stainless steel or the like. The chamber 12 is frame-grounded.

The chamber 12 defines a space S where a target object to be processed (e.g., a semiconductor wafer) W is accommodated and a plasma is generated. The chamber 12 has a sidewall 12a, a bottom 12b, and a ceiling 12c. The sidewall 12a has a substantially cylindrical shape. The bottom 12b is provided at a lower end side of the sidewall 12a. A gas exhaust hole 12h is formed in a part of the bottom 12b. The sidewall 12a has an opening at an upper end thereof. The opening formed at the upper end of the sidewall 12a is closed by a dielectric window 14. The dielectric window 14 is inserted between the upper end of the sidewall 12a and the ceiling 12c. A sealing member 16 may be provided between the dielectric window 14 and the upper end of the sidewall 12a. The sealing member 16 is, e.g., an O-ring, and contributes to sealing of the chamber 12.

The plasma processing apparatus includes a stage 20 for mounting thereon the target object W in the chamber 12. The stage 20 is provided below the dielectric window 14. In one configuration example, the stage 20 includes a susceptor (mounting table) 20a and an electrostatic chuck 20b.

The susceptor 20a is supported by a cylindrical support member 22. The cylindrical support member 22 is made of an insulating material and extends vertically upward from the bottom 12b. A conductive cylindrical support portion 24 is provided at an outer periphery of the cylindrical support member 22. The cylindrical support portion 24 extends vertically upward from the bottom 12b of the chamber 12 along the outer periphery of the cylindrical support member 22. An annular gas exhaust passageway 26 is formed between the cylindrical support portion 24 and the sidewall 12a.

An annular baffle plate 28 having a plurality of through holes is provided in an upper portion of the gas exhaust passageway 26. The gas exhaust passageway 26 is connected to a gas exhaust line 30 through the gas exhaust hole 12h. A gas exhaust unit 34 is connected to the gas exhaust line 30 via a pressure controller, e.g., an automatic pressure control (APC) valve 32. The gas exhaust unit 34 includes a vacuum pump such as a turbo molecular pump or the like. By operating the gas exhaust unit 34, a gas can be discharged out of the chamber 12 through the gas exhaust passageway 26 from the periphery of the stage 20. The pressure controller 32 controls a pressure in the chamber 12 by controlling a gas exhaust amount of the gas exhaust unit 34. The plasma generating space S in the chamber 12 can be depressurized to a desired vacuum level by the pressure controller 32 and the gas exhaust unit 34.

The susceptor 20a is made of a conductor, e.g., aluminum or the like, and serves also as a high frequency electrode. A high frequency power supply 40 for RF bias is electrically connected to the susceptor 20a via a high frequency automatic matcher 36 and a power feed rod 38. The high frequency power supply 40 is configured to output a high frequency power of, e.g., 13.65 MHz, suitable for control of energy of ions incident on the target object W at a preset power.

The high frequency automatic matcher 36 matches an impedance at the side of the high frequency power supply 40 with an impedance at the side of a load mainly including the plasma in the chamber 12. Although it is not illustrated, the high frequency automatic matcher 36 includes a matching circuit having a plurality of, e.g., two, controllable reactance devices (e.g., variable capacitors) connected to a high frequency power feed line; a matching control unit for variably controlling reactance values (positions of the variable capacitors) of the reactance devices by a driving control of the motor; an impedance sensor for measuring an impedance at the side of the load including an impedance of the matching circuit on the high frequency power feed line; and the like.

The electrostatic chuck 20b is provided on a top surface of the susceptor 20a. In the configuration example, the top surface of the electrostatic chuck 20b serves as a mounting area for mounting thereon the target object W. The electrostatic chuck 20b holds the target object W thereon by electrostatic attraction force. A focus ring F surrounding the target object W in an annular shape is provided at a radially outer side of the electrostatic chuck 20b. The electrostatic chuck 20b includes an electrode 20d, an insulating film 20e, and an insulating film 20f. The electrode 20d is a conductive film provided between the insulating film 20e and the insulating film 20f. A high voltage DC power supply 42 is electrically connected to the electrode 20d via a switch 44 and a coated line 46. The electrostatic chuck 20b can attract and hold the target object W on the top surface thereof by the electrostatic attraction force generated by a DC voltage applied from the DC power supply 42.

An annular coolant channel 20g extending in a circumferential direction is provided inside the susceptor 20a. A coolant, e.g., cooling water wc, of a predetermined temperature from a chiller unit (not shown) is circulated in the coolant channel 20g through lines 48 and 50. A processing temperature of the target object W on the electrostatic chuck 20b can be controlled by a temperature of the cooling water wc. A heat transfer gas, e.g., He gas, from a heat transfer gas supply unit (not shown) is supplied to a gap between the top surface of the electrostatic chuck 20b and a backside of the target object W through a gas supply line 52.

In the configuration example, the plasma processing apparatus 10 may further include heaters HT, HS, HCS and HES as a temperature control mechanism. The heater HT is provided in the ceiling 12c and extends in an annular shape to surround an antenna 66. The heater HS is provided in the sidewall 12a at a height position between the dielectric window 14 and the stage 20 and extends in an annular shape. The heater HCS is provided in the susceptor 20a to correspond to a central portion of the target object W. The heater HES is provided in the susceptor 20a in an annular shape to surround the heater HCS and correspond to a peripheral portion of the target object W.

The plasma processing apparatus 10 includes a microwave supply unit 54 for supplying microwave MW for plasma generation into the chamber 12 through the dielectric window 14. The microwave supply unit 54 includes a microwave generator 56, a waveguide 58, a microwave automatic matcher 60, a mode transducer 62, a coaxial waveguide 64 and the antenna 66.

The microwave generator 56 is configured to generate microwave of a predetermined frequency, e.g., 2.45 GHZ, at a preset power. The microwave generator 56 is connected to the antenna 66 through the microwave transmission line, i.e., through the waveguide 58, the mode transducer 62 and the coaxial waveguide 64. The microwave automatic matcher 60 is attached to the waveguide 58. Generally, a rectangular waveguide having a square cross section is used as the waveguide 58. The microwave automatic matcher 60 is a main feature of the embodiment. The configuration and the operation thereof will be described in detail later.

The coaxial waveguide 64 includes an outer conductor 6a and an inner conductor 64b formed in a cylindrical or a tubular shape and coaxially extending about a central axis of the chamber 12. A lower end of the outer conductor 64a is electrically connected to an upper portion of a cooling jacket 68 having a conductive surface. A lower end of the inner conductor 64b is connected to a slot plate 72 of the antenna 66 through a connector 92.

In the configuration example, the antenna 66 is provided in an opening formed at the ceiling 12c. The antenna 66 includes a dielectric plate 70 and the slot plate 72. The dielectric plate 70 shortens a wavelength of the microwave and has a substantially circular plate shape. The dielectric plate 70 is made of, e.g., quartz or alumina. The dielectric plate 70 is interposed between the slot plate and a bottom surface of the cooling jacket 68. The antenna 66 includes the dielectric plate 70, the slot plate 72 and the bottom surface of the cooling jacket 68.

Figure 2:
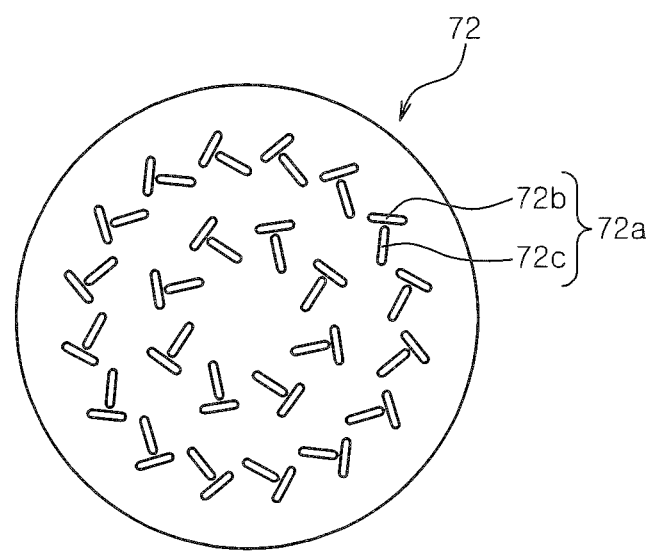
FIG. 2 is a top view showing an exemplary configuration of a slot plate of an antenna of the plasma processing apparatus.

The slot plate 72 is a metal plate having a plurality of slot pairs. In the configuration example, the antenna 66 is a radial line slot antenna. As shown in FIG. 2, the slot plate 72 has a plurality of slot pairs 72a. The slot pairs 72a are spaced apart from each other at a regular interval in a diametrical direction and in a circumferential direction. Each of the slot pairs 72a has two slot holes 72b and 72c. The slot holes 72b and 72c extend in a directions intersecting each other or orthogonal to each other.

Referring back to FIG. 1, the microwave outputted from the microwave generator 56 is supplied to the antenna 66 through the waveguide 58, the mode transducer 62 and the coaxial waveguide 64. The microwave, which has propagated radially in the dielectric plate 70 of the antenna 66 with its wavelength shortened, becomes a plane wave of a circularly polarized wave containing two polarized wave components perpendicular to each other. Then, the plane wave is radiated to the plasma generating space S in the chamber 12 through each of the slot pairs 72a of the slot plate 72.

In the configuration example, an annular recess 14a is formed in a tapered shape at a bottom surface of the dielectric window 14 such that a width of the recess 14a becomes gradually decreased toward an upper side. The recess 14a promotes generation of a standing wave by the microwave introduced into the chamber 12. By providing the recess 14a, it is possible to efficiently generate the plasma by the microwave discharge.

This plasma processing apparatus includes a process gas supply unit 80 for supplying all process gases for use in the plasma process, and a plurality of, e.g., two, gas lines serving as a gas introduction mechanism for introducing the process gases supplied from the process gas supply unit 80 into the chamber 12, i.e., a ceiling gas line and a sidewall gas line 84. The ceiling gas line 82 extends to a gas channel and a gas injection hole in the dielectric window 14. The sidewall gas line 84 extends to a gas channel and a gas injection hole in the sidewall 12a of the chamber 12.

The ceiling gas line 82 extends to a hollow gas channel 86 extending through the inner conductor 64b of the coaxial waveguide 64 in an axial direction. The gas supply line 88 from the process gas supply unit 80 is connected to an upper end of the inner conductor 64b. The gas supply line 88 communicates with the gas channel 86 of the coaxial waveguide 64. An electromagnetic valve (opening/closing valve) 90 is provided in the gas supply line 88.

The connector 92 is connected to the lower end of the inner conductor 64b. The connector 92 is made of a conductor, e.g., copper, aluminum, stainless steel or an alloy thereof, and accommodated in a cylindrical recess 14b formed in the top surface of the dielectric window 14. Formed in a central portion of the connector 92 is a through-hole or a gas channel 92a communicating with the gas channel 86 of the coaxial waveguide 64.

One or more ceiling gas injection holes 94 are formed in a central portion of a bottom surface of the dielectric window 14 to face the plasma generating space S in the chamber 12. Formed at the central portion of the dielectric window 14 is a dielectric window gas channel 96 extending from a bottom surface of the recess 14b, i.e., the lower end of the gas channel 92a of the connector 92, to the ceiling gas injection holes 94. The dielectric window gas channel 96 and the ceiling gas injection holes 94 form an injector.

The process gas supplied from the process gas supply unit 80 to the ceiling gas line 82 flows through the first gas supply line 88, the gas channel 86 of the coaxial waveguide 64, the gas channel 92a of the connector 92, and the dielectric window gas channel 96 in that order. Then, the process gas is injected downward through the ceiling gas injection holes 94 toward the central portion of the stage 20.

The sidewall gas line 84 includes: an anular buffer space (manifold) 100 formed in the sidewall 12a of the chamber 12 at a height position between the dielectric window 14 and the stage 20; a plurality of sidewall gas injection holes 102 arranged at a regular interval in a circumferential direction, the sidewall gas injection holes 102 extending from the buffer chamber 100 to face the plasma generating space S; and a gas supply line 104 extending from the process gas supply unit 80 to the buffer chamber 100. An electromagnetic valve (opening/closing valve) 106 is provided in the gas supply line 104.

The process gas supplied from the process gas supply unit 80 to the sidewall gas line 84 flows through the second gas supply line 104 and the buffer chamber 100 in the sidewall 12a in that order to be ejected through the sidewall gas injection holes 102 toward the peripheral portion of the stage 20 in a substantially horizontal direction or in a diagonally downward direction.

The main control unit 110 has a microcomputer and controls the operation of the whole apparatus and the operations of the respective components of the plasma processing apparatus 10, e.g., the pressure controller 32, the gas exhaust unit 34, the high frequency automatic matcher 36, the high frequency power supply 40, the switch 44 for the electrostatic chuck 20b, the microwave generator 56, the microwave automatic matcher 60, the process gas supply unit 80, the electromagnetic valves 90 and 106 of the gas lines 82 and 84, the heaters HT, HS, HCS and HES, the heat transfer gas supply unit, the chiller unit and the like. Further, the main control unit 110 is connected to an input device and a display device (both not shown) for a man-machine interface, and a storage unit (not shown) storing software (various programs, setting data and the like) for specifying the operation of each component of the plasma processing apparatus and overall operations or sequences of the plasma processing apparatus.

In this plasma processing apparatus, when dry etching is performed as the plasma process, for example, the target object W to be processed is loaded into the chamber 10 and mounted on the electrostatic chuck 20b. Next, an etching gas (generally, a gaseous mixture) is introduced from the process gas supply unit 80 into the chamber 10 at a predetermined flow rate and a predetermined flow rate ratio through the dual gas lines 82 and 84. Then, a pressure in the chamber 10 is decreased to a set level by the pressure controller 32 and the gas exhaust unit 34. Further, a temperature of each component in the chamber 10 is controlled to a set level by each of the heaters HT, HS, HCS and HES. A predetermined high frequency power for RF bias is outputted by switching on the high frequency power supply 40. This high frequency power is applied to the susceptor 20a via the high frequency automatic matcher 36 and the power feed rod 38. Further, a DC high voltage is applied from the DC power supply 42 to the electrode 20d of the electrostatic chuck 20b by switching on the switch 44, thereby holding the target object W on the stage 20 by electrostatic attraction force of the electrostatic chuck 20b.

The microwave MW of 2.45 GHz outputted from the microwave generator 56 at a predetermined power is supplied to the antenna 66 through the microwave transmission lines 58, 62 and 64 by switching ON the microwave automatic matcher 60 and the microwave generator 56. In the microwave transmission line, the microwave propagates in the TE mode or TM mode in the waveguide 58 and in the TEM mode in the coaxial waveguide 64.

The microwave supplied to the antenna 66 propagates radially outward in the dielectric plate 70 of the antenna while its wavelength is being shortened. Then, the microwave becomes a plane wave of a circularly polarized wave containing two polarized wave components perpendicular to each other to be radiated to the plasma generating space S in the chamber 12 through each of the slot pairs 72a of the slot plate 72. The gas, near the electric field (microwave electric field) of the surface wave propagating in the radial direction along the surface of the dielectric window 14, is ionized by the electric field. Therefore, a plasma having a high density and a low electron temperature is generated. Accordingly, the plasma generated near dielectric window 14 is diffused downward and the processing target film on the main surface of the target object W is etched by radicals or ions in the plasma thus generated.

In this plasma processing apparatus 10, by the operation of the microwave automatic matcher 60 which will be described later, it is possible to effectively prevent the hunting of the plasma emission which is caused by the characteristic mode jump of the electron density of the plasma generated by the microwave discharge. Accordingly, stability, reproducibility, and quality (uniformity, yield and the like) of the plasma process can be improved.

<Configuration of the Microwave Automatic Matcher According to the Embodiment>

Figure 3:
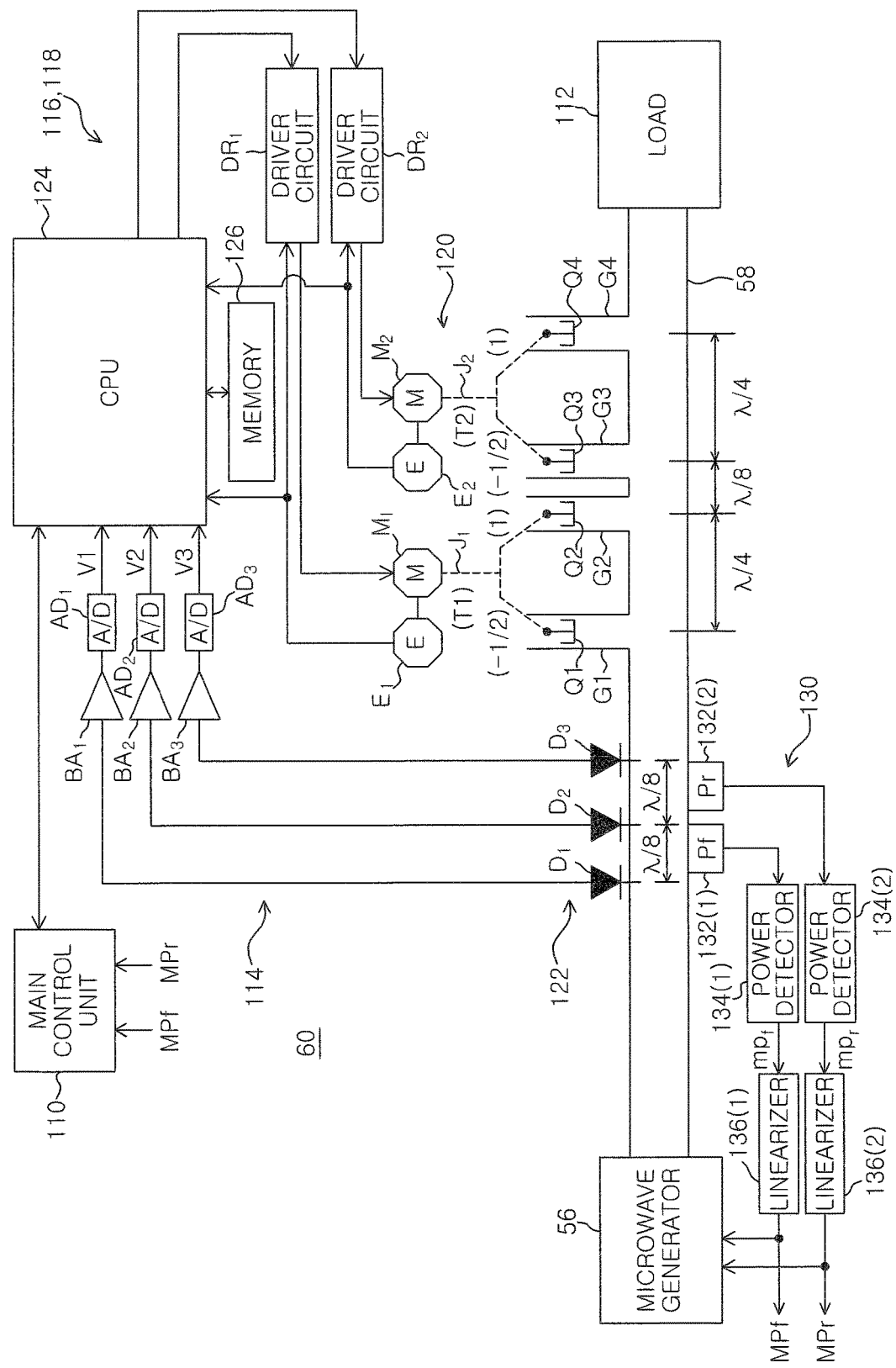
FIG. 3 is a block diagram showing a configuration of the microwave automatic matcher.

Hereinafter, the configuration of the microwave automatic matcher 60 of the embodiment will be described with reference to FIG. 3.

The microwave automatic matcher 60 is configured as a 4E tuner. Four branch waveguides $G_1$ to $G_4$ are connected to an E-plane of the waveguide 58 while being spaced apart at predetermined intervals of, i.e., $\lambda/4$, $\lambda/8$ (or odd multiple of $\lambda/8$) and $\lambda/4$, in a traveling direction of the microwave. Movable short-circuit plates $Q_1$ to $Q_4$ are arranged to be movable axially in the branch waveguides $G_1$ to $G_4$, respectively. Here, $\lambda$ represents a wavelength of the microwave propagating through the waveguide 58. When the positions of the movable short-circuit plates $Q_1$ to $Q_4$ are changed in the branch waveguides $G_1$ to $G_4$, the characteristic impedance of the waveguide 58 is changed. Based on the above, the impedance of the load which is obtained by applying an impedance of the tuner to a load 112 can be matched with the impedance of the microwave generator 56. The load 112 is mainly a plasma generated in the chamber 12 and, specifically, also include the mode transducer 62, the coaxial waveguide 64 and the antenna 66 at the downstream side of the waveguide 58.

The microwave automatic matcher 60 includes a reflection coefficient measuring unit 114, a matching control unit 116, a setting unit 118, and a driving unit 120.

The reflection coefficient measuring unit 114 includes: a probe type sensor 122 attached to the waveguide 58 at a location closer to the microwave generator 56 than the branch waveguide $G_1$; a CPU (microprocessor) 124 configured to carry out a predetermined operation for obtaining a measurement of the reflection coefficient by reading out the sensor output signals $V_1$ to $V_3$ from the probe type sensor 122; and a memory 126 that provides the CPU 124 with a memory space, data and a program required for the operation process of the reflection coefficient measurement. The memory 126 typically includes one or more non-volatile memory devices and one or more volatile memory devices.

More specifically, the probe type sensor 122 is configured as a wave detector having three probes. Three probes $D_1$ to $D_3$ with diodes are linearly arranged to the E-plane of the waveguide 58 at a regular interval ($\lambda/8$) in the traveling direction of the microwave. Tip ends of the probes are inserted into the waveguide 58. When $\Gamma$ represents a reflection coefficient (complex reflection coefficient) of the standing wave (traveling wave and reflection wave) of the microwave propagating through the waveguide 58 which is monitored at the position of the sensor 122, output voltages of the diode detector obtained from the respective probes $D_1$ to $D_3$, i.e., the sensor output signals $V_1$ to $V_3$, can be expressed by the following equations (1) to (3):

$$V_1 = A^*(1+|\Gamma|^2+2|\Gamma|\cos\theta) \qquad (1)$$

$$V_2 = A^*(1+|\Gamma|^2-2|\Gamma|\sin\theta) \qquad (2)$$

$$V_3 = A^*(1+|\Gamma|^2-2|\Gamma|\cos\theta) \qquad (3)$$

where A represents a proportional constant, and $|\Gamma|$ and $\theta$ represent the magnitude and a phase of the reflection coefficient $\Gamma$, respectively.

The CPU 124 receives the sensor output signals $V_1$ to $V_3$ through the buffer amplifiers $BA_1$ to $BA_3$ and the A/D converter $AD_1$ to $AD_3$, respectively. The buffer amplifiers $BA_1$ to $BA_3$ are configured to perform the impedance conversion and the required signal amplification as well as calibration for correcting the variation of the sensitivity of the probes $D_1$ to $D_3$.

The CPU 124 obtains measurements $V_a$ and $V_b$ of a real and an imaginary part of the reflection coefficient $\Gamma$ by performing operations expressed by the following equations (4) and (5) on the received sensor output signals $V_1$ to $V_3$:

$$V_a = (V_1-V_3)/4A = |\Gamma|\cos\theta \qquad (4)$$

$$V_b = (V_1+V_3-2V_2)/4A = |\Gamma|\sin\theta \qquad (5).$$

Further, the CPU 124 can obtain respective measurements $|\Gamma_M|$ and $\theta_M$ of the magnitude $|\Gamma|$ of the reflection coefficient $\Gamma$ and the phase $\theta$ from $V_a$ and $V_b$ by performing operations expressed by the following equations (6) and (7):

$$|\Gamma_M| = (V_a^2+V_b^2)^{1/2} \qquad (6)$$

$$\theta_M = \tan^{-1}(V_a/V_b) \qquad (7)$$

A measurement $\Gamma_M$ of the reflection coefficient $\Gamma$, which is obtained as $(V_a, V_b)$ or $(|\Gamma_M|, \theta_M)$ by the reflection coefficient measuring unit 114, is used for the feedback signal of the automatic matching in the matching control unit 116 and is transmitted to the main control unit 110 to display a monitoring result of the reflection coefficient.

When the probe type sensor 122 is configured as the wave detector having three probes, the sensor output signals $V_1$ to $V_3$ having the square-law characteristics are obtained. In the embodiment, a linear correction on the square-law characteristics of the sensor output signals $V_1$ to $V_3$ is performed in the CPU 124.

The matching control unit 116 includes the CPU 124 for performing a main control of the matching operation and accompanying operations, and the memory 126 for providing the CPU 124 with a memory space, data and a program required for the operation process or the signal process in the control operation. The CPU 124 transmits control signals for controlling the positions of the movable short-circuit plates $Q_1$ to $Q_4$ to the driving unit 120 based on the measurement $\Gamma_M$ of the reflection coefficient $\Gamma$ obtained from the reflection coefficient measuring unit 114 or by an independent control routine in which the measurement $\Gamma_M$ of the reflection coefficient $\Gamma$ is disregarded. The CPU 124 of the embodiment is configured to receive output signals of encoders $E_1$ and $E_2$ serving as position sensors in the driving unit 120 which will be described later to thereby constantly monitor or measure the positions of the movable short-circuit plates $Q_1$ to $Q_4$.

The setting unit 118 includes: the CPU 124 for performing setting required for the control of the matching operation and the accompanying operations; the memory 126 for providing the CPU 124 with the memory space, the data and the program required for the setting process; and the main control unit 110 for transmitting program data or set value data related to the automatic matching inputted through the man-machine interface to the CPU 124.

The driving unit 120 includes two motors $M_1$ and $M_2$, dual-line power transmission mechanisms $J_1$ and $J_2$ for transmitting driving forces generated by the motors $M_1$ and $M_2$ to two pairs of the movable short-circuit plates ($Q_1$, $Q_2$) and ($Q_3$, $Q_4$), respectively, and dual-line driver circuits $DR_1$ and $DR_2$ for electrically exciting or driving the motors $M_1$ and $M_2$, respectively, based on the control signals from the matching control unit 116.

Each of the motors $M_1$ and $M_2$ may be, e.g., a DC servo motor, an AC servo motor, or a stepper motor. Rotary encoders $E_1$ and $E_2$ are attached to the motors $M_1$ and $M_2$, respectively, in order to perform position controls with high accuracy. Output signals of the rotary encoders $E_1$ and $E_2$ are transmitted as feedback signals for the position controls to the driver circuits $DR_1$ and $DR_2$, respectively.

The motor $M_1$ is operatively connected to the first pair of the movable short-circuit plates $Q_1$ and $Q_2$ via the power transmission mechanism $J_1$. The power transmission mechanism $J_1$ connects the movable short-circuit plates $Q_1$ and $Q_2$ by a link and converts a rotational movement of a rotational driving shaft of the motor $M_1$ to a linear movement of the movable short-circuit plates $Q_1$ and $Q_2$. When the movable short-circuit plate $Q_2$ positioned at the downstream side of the traveling direction of the microwave is moved in one direction by a unit distance U, the movable short-circuit plate $Q_1$ positioned at the upstream side of the traveling direction of the microwave is moved in the opposite direction by a distance U/2 corresponding to a half of the unit distance.

The motor $M_2$ is operatively connected to the second pair of the movable short-circuit plate $Q_3$ and $Q_4$ through the power transmission mechanism $J_2$. The power transmission mechanism $J_2$ connects the movable short-circuit plates $Q_3$ and $Q_4$ by a link and converts a rotational movement of a rotational driving shaft of the motor $M_2$ to a linear movement of the movable short-circuit plates $Q_3$ and $Q_4$. When the movable short-circuit plate $Q_4$ disposed at the downstream side of the traveling direction of the microwave is moved in one direction by the unit distance U, the movable short-circuit plate $Q_3$ disposed at the upstream side of the traveling direction of the microwave is moved in the opposite direction by a distance U/2 corresponding to a half of the unit distance.

As described above, the rotational angle position of the motor $M_1$ is correlated to the positions of the first pair of the movable short-circuit plates $Q_1$ and $Q_2$, and the rotational angle position of the motor $M_2$ is correlated to the positions of the second pair of the movable short-circuit plates $Q_3$ and $Q_4$. Hereinafter, the rotational angle positions of the motors $M_1$ and $M_2$ or the positions of the movable short-circuit plates $Q_1$ and $Q_2$ and $Q_3$ and $Q_4$ are referred to as tuner positions $T_1$ and $T_2$.

The plasma processing apparatus 10 includes a microwave power monitor 130 for measuring a power of the microwave (traveling wave/reflection wave) propagating in the waveguide 58. The power monitor 130 includes a directional coupler 132(1), a power detector 134(1) and a linearizer 136(1) for use in a traveling wave system, and a directional coupler 132(2), a power detector 134(2) and a linearizer 136(2) for use in a reflection wave system. Generally, the directional couplers 132(1) and 132(2) are attached to the waveguide 58 near the probe type sensor 122.

In the traveling wave system, the directional coupler 132(1) extracts a voltage signal of a square-law detection which corresponds to the power of the traveling wave. The power detector 134(1) generates a signal $mp_f$ indicating a measurement of the power of the traveling wave based on the voltage signal of the square-law detection. The linearizer 136(1) performs a linear correction on the square-law characteristics of the output signal $mp_f$ of the power detector 134(1) and outputs a signal $MP_f$ indicating a measurement of a corrected power of the traveling wave.

In the reflection wave system, the directional coupler 132(2) extracts a voltage signal of a square-law detection which corresponds to the power of the reflection wave. The power detector 134(2) generates a signal $mp_r$ indicating a measurement of the the power of the reflection wave based on the voltage signal of the square-law detection. The linearizer 136(2) performs a linear correction on the square-law characteristics of the output signal $mp_r$ of the power detector 134(2) and outputs a signal $MP_r$ indicating a measurement of a corrected power of the reflection wave.

The signal $MP_f$ and the signal $MP_r$ obtained by the microwave power monitor 130 are transmitted to the main control unit 110 in order to display the monitoring result of the microwave power and also transmitted to the microwave generator 56 in order to perform a feedback control of the microwave power.

The microwave generator 56 includes: a microwave oscillator, e.g., a magnetron, for oscillating and outputting microwave MW of a predetermined frequency (2.45 GHz); a power supply circuit for supplying a power to the magnetron; and a power control circuit for controlling an oscillation output of the magnetron through the power circuit. The power control circuit is configured to selectively perform one of a control of maintaining the power of the traveling wave at a preset level and a control of maintaining an input power (load power) obtained by subtracting the power of the reflection wave from the power of the traveling wave at a preset level by using the power measurement signals $MP_f$ and $MP_r$ from the microwave power monitor 130 as the feedback signals.

<Function of the Setting Unit in the Microwave Automatic Matcher According to the Embodiment>

Next, the function of the setting unit 118 in the microwave automatic matcher 60 of the embodiment will be described with reference to FIG. 4.

FIG. 4 shows main parameter information (setting items, set values) set by the setting unit 118 on the automatic matching of the embodiment. In this example, there are prepared ten parameters, i.e., "off preset enable/disable", "off preset positions", "off preset timer", "on preset enable/disable", "on preset positions", "on preset timer", "$T_{in}$", "$\Gamma_{th}$", "$\Gamma_h$", and "motor speed". The people involved such as process engineers and the like can input, as recipe information related to the plasma process, desired set values or setting information on the respective parameters on a preset No. basis through the man-machine interface of the main control unit 110.

The parameter of "off preset positions" indicates destination positions in the case of forcibly shifting the tuner positions $T_1$ and $T_2$ to specific positions (start positions) at the time of start of the discharge (plasma ignition). The parameter of "off preset timer" indicates a length of time in which the tuner positions $T_1$ and $T_2$ shifted to the off preset positions are maintained at the off preset positions after the microwave is turned on. The people involved may select utilization (validity) or non-utilization (invalidity) of the off preset positions depending on whether the off preset is set to "enable (En)" or "disable (Di)".

The parameter of "on preset positions" indicates destination positions in the case of forcibly shifting the tuner positions $T_1$ and $T_2$ to specific positions (start positions) in order to stabilize the plasma ignited by the start of the discharge or when the plasma generation is interrupted. The parameter of "on preset timer" indicates a length of time in which the tuner positions $T_1$ and $T_2$ shifted to the on preset positions are maintained at the on preset positions. The people involved may select utilization (validity) or non-utilization (invalidity) of the on preset positions depending on whether the on preset is set to "enable (En)" or "disable (Di)".

The parameter of "$\Gamma_{in}$" indicates a target value (complex number) that is a matching point to which the current value of the reflection coefficient $\Gamma$, corresponding to the current positions of the tuner positions $T_1$ and $T_2$, is converged in the matching operation. The target value $\Gamma_{in}$ is typically set in the form of the magnitude $|\Gamma_{in}|$ and the phase $\theta_{in}$ but may also be set in the form of a real part $|\Gamma_{in}|\cos\theta$ and an imaginary part $|\Gamma_{in}|\sin$. The parameter of "$\Gamma_{th}$" indicates a first neighboring range surrounding the target value $\Gamma_{in}$ of the reflection coefficient $\Gamma$. The first neighboring range specifies an inside of a circle of a radius $\Gamma_{th}$ having the target value $\Gamma_{in}$ on the $\Gamma$ chart (Smith chart) as its center. The parameter of "$\Gamma_h$" indicates a second neighboring range surrounding the target value $\Gamma_{in}$ of the reflection coefficient $\Gamma$ at the outer side of the first neighboring range $\Gamma_{th}$. The second neighboring range specifies an inside of a circle of a radius $\Gamma_h$ having the target value $\Gamma_{in}$ on the $\Gamma$ chart (Smith chart) as its center. The parameter of "motor speed" indicates a rotation speed or a transfer speed of the motors $M_1$ and $M_2$.

In the example of FIG. 4, a preset No. 2 is set as a recipe for a certain plasma process. In this case, the off preset enable/disable and the on preset enable/disable are set to "enable (En)". Accordingly, in the plasma process, the set values of the off preset positions, i.e., "−20, −30" (unit being omitted), are used respectively as the tuner positions $T_1$ and $T_2$ at the time of the start of the discharge. Further, the set values of the on preset positions, i.e., "10, 10" (unit being omitted), are used respectively as the tuner positions $TP_1$ and $TP_2$ immediately after the start of the discharge or at the time of the occurrence of interrupt during the plasma generation. In the matching operation of the plasma process, the set value "0.050, 0" (unit being omitted) is used as the target value $\Gamma_{in}$ ($|\Gamma_{in}|$, $\theta_{in}$) of the reflection coefficient $\Gamma$ which is changed by the variable control of the tuner positions $T_1$ and $T_2$. The set value "0.025" (unit being omitted) is used as the inner neighboring range $\Gamma_{th}$ used for a threshold for completing the matching operation. The set value "0.050" (unit being omitted) is used as the outer neighboring range $\Gamma_h$ used for a threshold for stably maintaining the matching completion state. The set value "10" (unit being omitted) is used as a motor speed for forcibly moving or consecutively moving the tuner positions $TP_1$ and $TP_2$ in one direction.

In the embodiment, the target value $\Gamma_{in}$ of the reflection coefficient $\Gamma$ is not limited to the origin (0,0) on the $\Gamma$ chart and may be set to a position ($|\Gamma_{in}|$=0, 050, $\theta_{in}$=0) offset from the origin (0,0) as in the case of the preset No. 2 shown in FIG. 4. In that case, the incomplete matching state, which allows a certain amount of reflection, is expected in the matching operation of the automatic matcher 60. However, such a setting may be positively effective in suppressing the hunting of the plasma emission, as will be described later.

The parameter information shown in FIG. 4 corresponds to the setting information inputted to the automatic matcher 60 through the main control unit 110 and is known to the people involved such as the process engineers or the like. The automatic matcher 60 sets, in addition to the parameter information shown in FIG. 4, the values of the tuner positions $T_1$ and $T_2$ corresponding to the target value $\Gamma_{in}$ of the reflection coefficient $\Gamma$ as the target positions $ST_1$ and $ST_2$ (i.e., the positions corresponding to the target positions of the movable short-circuit plates $Q_1$ to $Q_4$) and stores the set values in the memory 126.

In the embodiment, when the target value $\Gamma_{in}$ ($|\Gamma_{in}|$, $\theta_{in}$) of the reflection coefficient $\Gamma$ is set, the values of the tuner positions $T_1$ and $T_2$ corresponding to the target value $\Gamma_{in}$, i.e., the target positions $ST_1$ and $ST_2$, can be easily obtained from the numerical information accumulated in the memory 126. In other words, when the plasma processing apparatus 10 is operated, the automatic matcher 60 is also operated. The CPU 124 can obtain the measurement $\Gamma_M$ of the reflection coefficient $\Gamma$ in real time from the reflection coefficient measuring unit 114 during a certain plasma process and also can constantly monitor or measure the current positions of the tuner positions $T_1$ and $T_2$ and further the current positions of the movable short-circuit plates $Q_1$ to $Q_4$ by using the encoders $E_1$ and $E_2$ of the driving unit 120. Accordingly, database on the correlation between the reflection coefficient $\Gamma$ and the tuner positions $T_1$ and $T_2$ can be obtained by collecting data on correlation between $\Gamma$ and ($T_1$ and $T_2$) with respect to various types or recipes of the plasma process performed in the plasma processing apparatus 10.

Generally, the process engineers determine an optimal process recipe by repeatedly performing process tests using as parameters process conditions including a gas type, a pressure, a microwave power and the like for a required plasma process. Therefore, the target value $\Gamma_{in}$ of the reflection coefficient $\Gamma$ which is inputted to the automatic matcher 60 through the main control unit 110 is generally determined based on the test result of the plasma process performed in the plasma processing apparatus 10 as in the case of determining the set values of "off preset positions" or "on preset positions". When the target value $\Gamma_{in}$ of the reflection coefficient $\Gamma$ is inputted, the setting unit 118 can retrieve the values of the tuner positions $T_1$ and $T_2$ corresponding to the target value $\Gamma_{in}$ of the reflection coefficient $\Gamma$, i.e., the target positions $ST_1$ and $ST_2$, by searching the accumulated information (database) in the memory 126.

The accumulated information or the database in the setting unit 118 is generally obtained based on the tests executed in the plasma processing apparatus 10. However, the accumulated information or the set value information related to the microwave automatic matching which has been obtained by a test executed in another plasma processing apparatus of the same type can be downloaded to the automatic matcher 60 of the main control unit 110 of the corresponding plasma processing apparatus 10.

<Operation of the Matching Control Unit in the Microwave Automatic Matcher According to the Embodiment>

Hereinafter, the operation of the matching control unit 116 in the microwave automatic matcher 60 of the embodiment will be described with reference to FIGS. 5 to 8.

Figure 5:
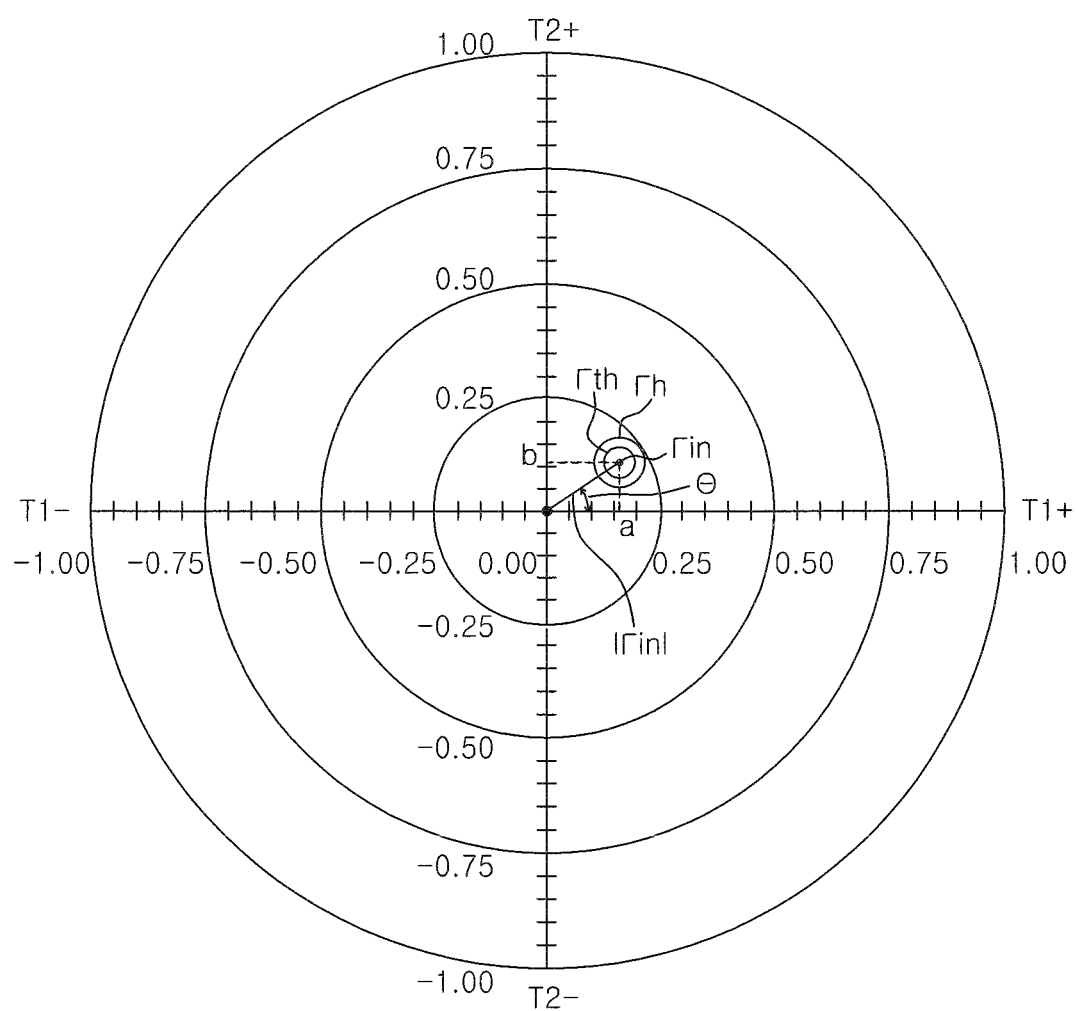
FIG. 5 is a Smith chart (Γ chart) showing a reflection coefficient for explaining an operation of a matching control unit of the microwave automatic matcher.

FIG. 5 is a Smith chart, i.e., a $\Gamma$ chart, on the reflection coefficient for explaining the operation of the matching control unit 116. In this $\Gamma$ chart, a horizontal axis represents a real part ($|\Gamma|\cos \theta$) and a vertical axis represents an imaginary part ($|\Gamma|\sin \theta$). A straight line connecting the position of the reflection coefficient $\Gamma$ and the origin (0,0) is a reflection coefficient vector. A length of the vector indicates the magnitude $|\Gamma|$ of the reflection coefficient $\Gamma$. An angle between the vector and the horizontal axis indicates the phase $\theta$ of the reflection vector $\Gamma$.

The origin (0, 0) of the $\Gamma$ chart is the matching point applied when the reflection hardly occurs. In the matching operation of the automatic matcher 60, when the measurement $\Gamma_M$ of the reflection coefficient $\Gamma$ obtained by the reflection coefficient measuring unit 114 coincides with the origin (0, 0), the microwave is hardly reflected toward the microwave generator 56 in the waveguide 58 and a substantially complete matching state is ensured or maintained. On the other hand, when the measurement $\Gamma_M$ of the reflection coefficient $\Gamma$ is offset from the origin (0, 0) within a certain range, the reflection wave propagates in the waveguide 58 toward the microwave generator 56 at a power corresponding to the offset amount and an incomplete matching state is obtained.

Figure 6A:
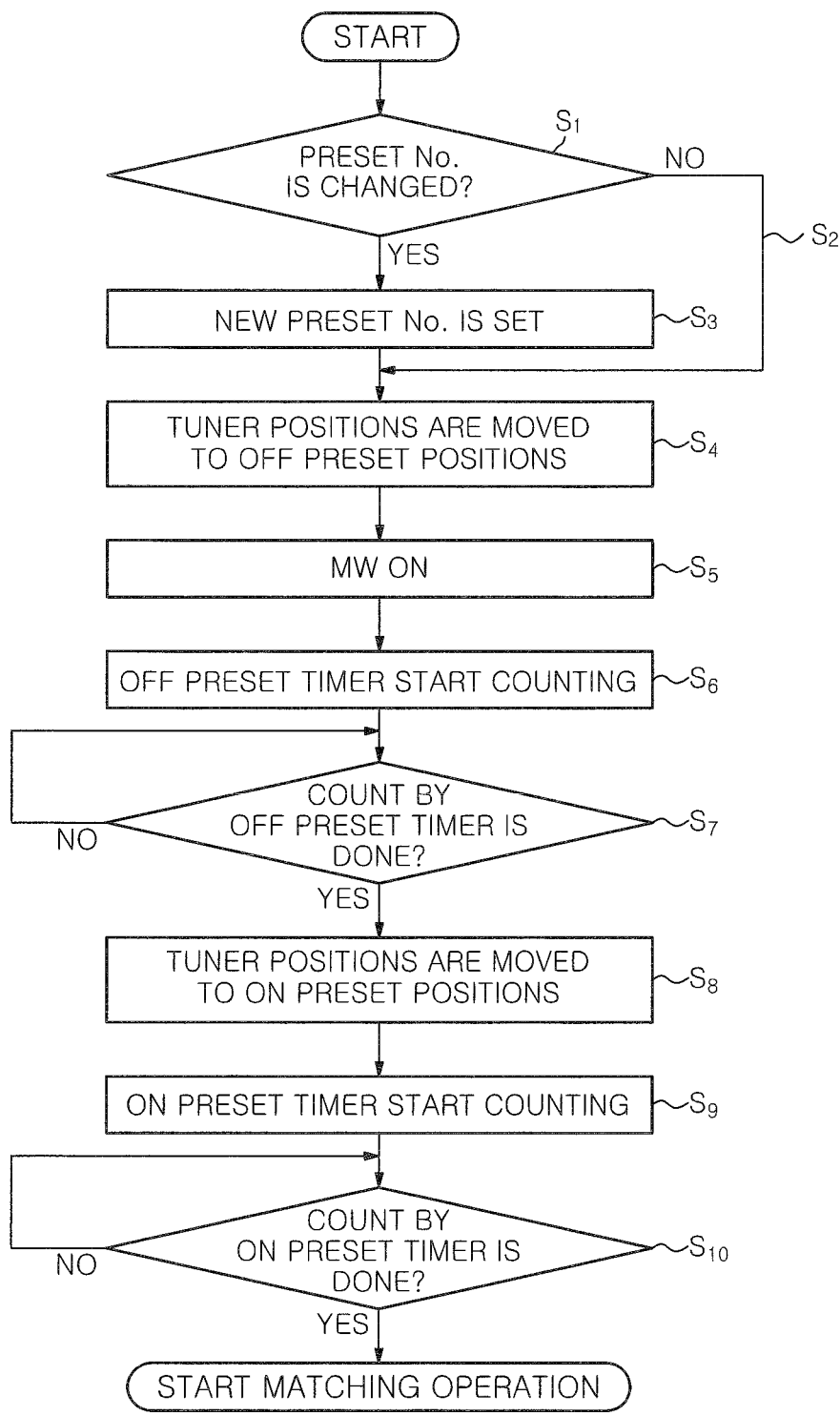
FIG. 6A is a flowchart showing a control sequence from a state in which a microwave generator is switched ON to a state in which a matching operation is started in the embodiment.
Figure 6B:
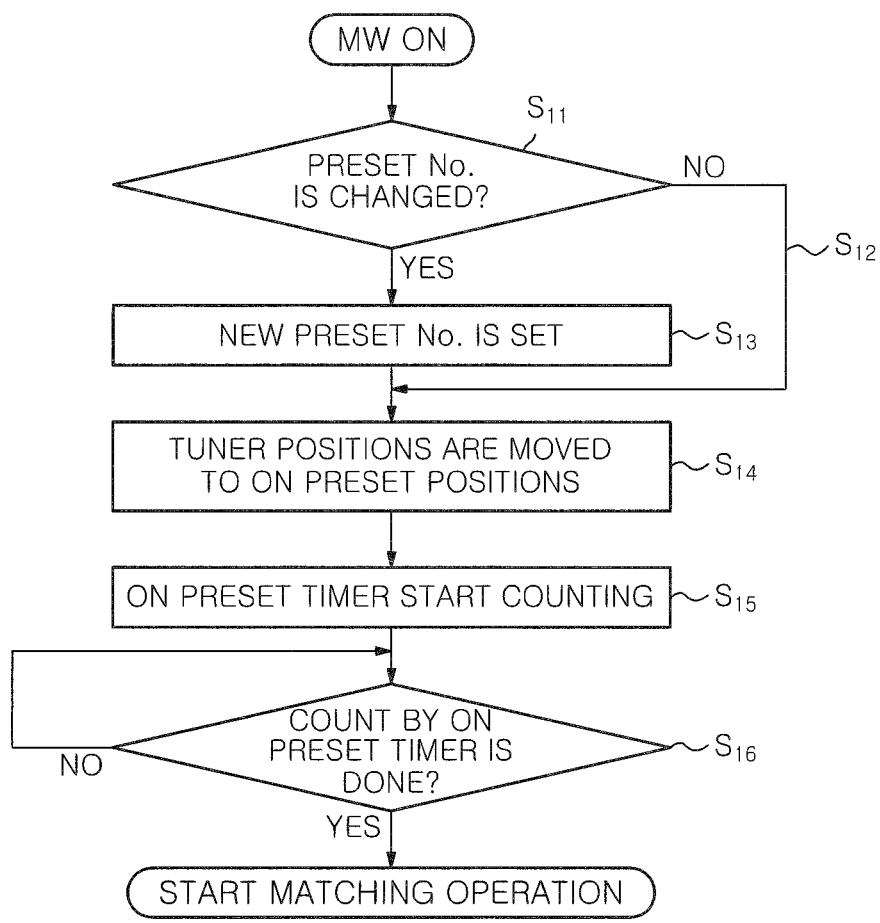
FIG. 6B is a flowchart showing a control sequence that is interrupted during the ON state of the microwave generator in the embodiment.
Figure 7:
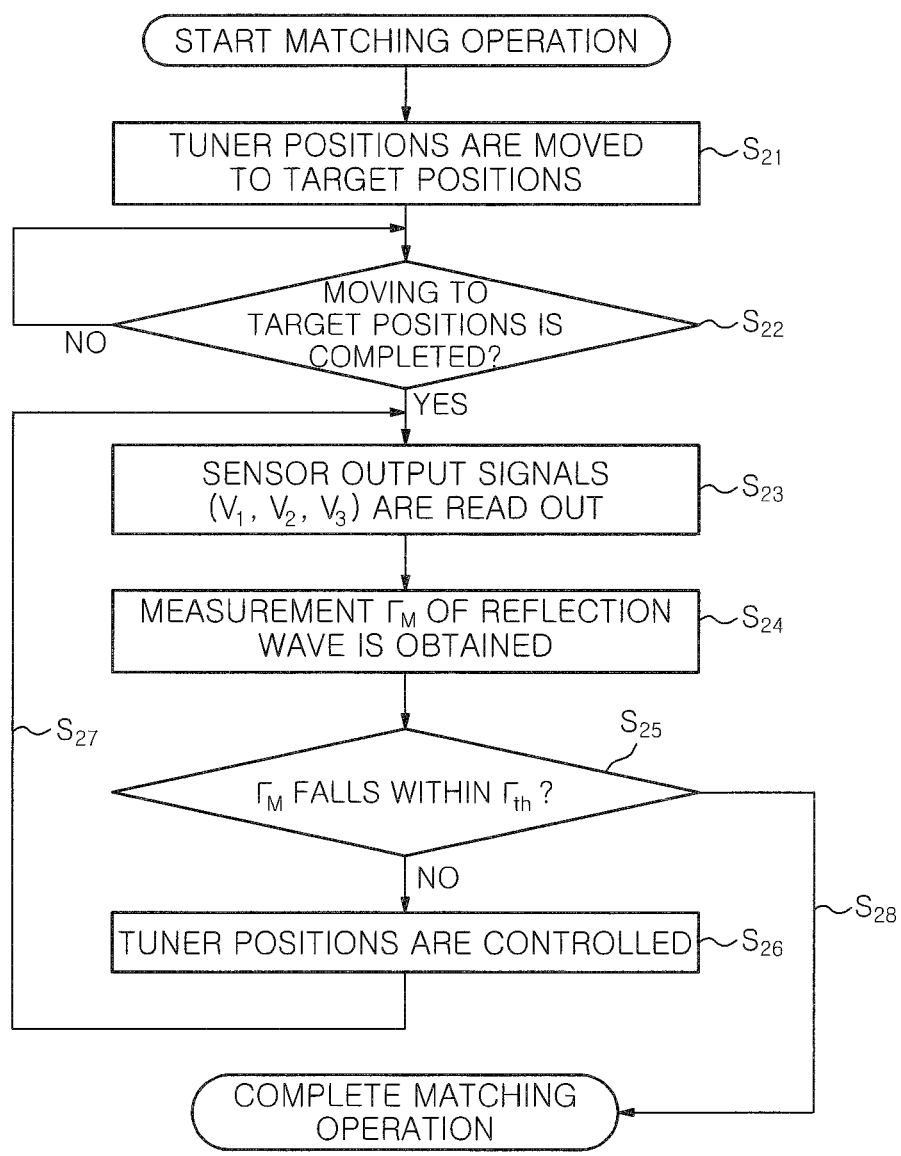
FIG. 7 is a flowchart showing a control sequence during the matching operation in the embodiment.
Figure 8:
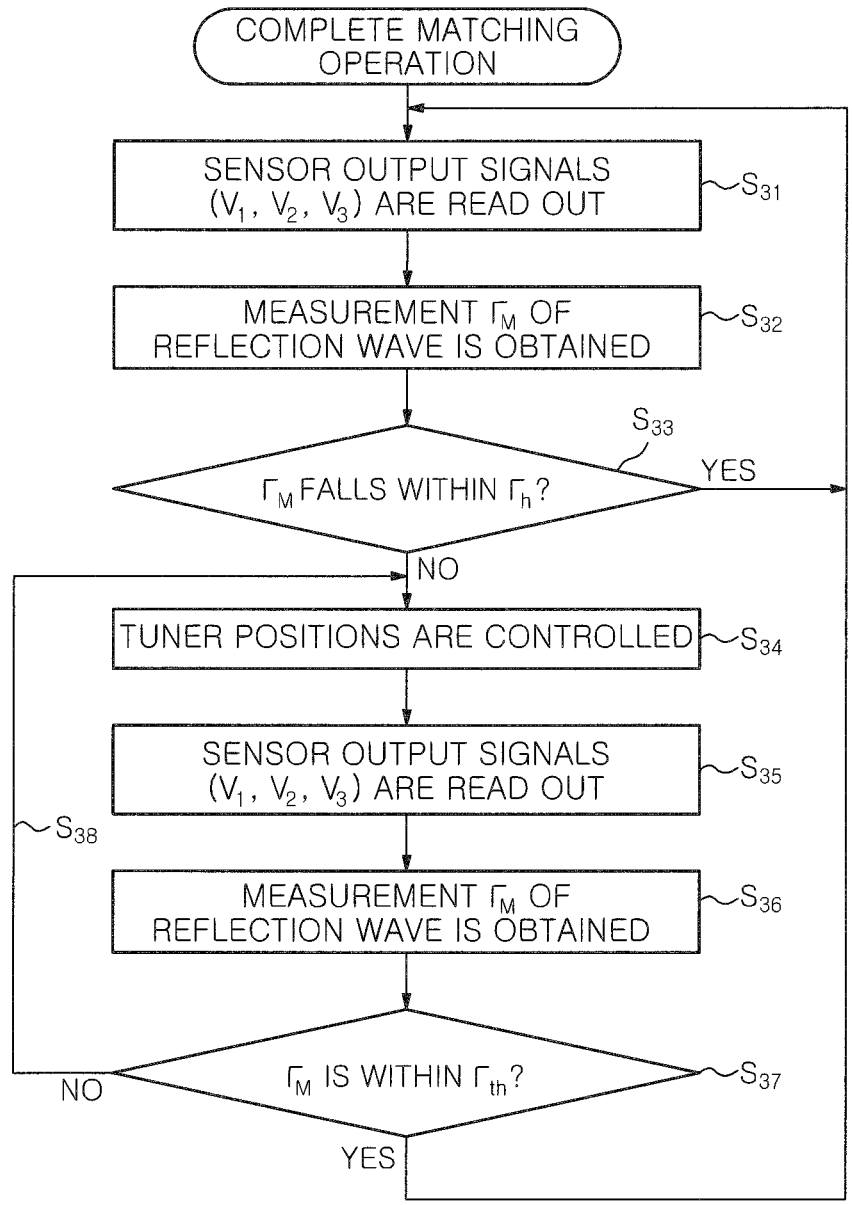
FIG. 8 shows a control sequence after completion of the matching operation in the embodiment.

FIGS. 6A to 8 are flowcharts showing the main sequence of the control performed by the matching control unit 116 when the required plasma process is performed in the plasma processing apparatus 10. FIG. 6A shows a control sequence before and after the supply of the microwave MW. FIG. 6B shows a control sequence applied when interrupt occurs during the supply of the microwave MW. FIG. 7 shows a control sequence during the matching operation. FIG. 8 shows a control sequence after the completion of the matching.

The control sequence of FIG. 6A is started after the automatic matcher 60 is switched ON by the instruction from the main control unit 110 at the time of the start of the plasma process. First, the matching control unit 116 determines whether or not the preset No. has been changed during initialization (step $S_1$). When the preset No. has not been changed, a set value group included in the current preset No. (FIG. 4) is used again (step $S_2$). When the preset No. has been changed, a set value group included in a new preset No. is newly set (step $S_3$).

After the initialization, the matching control unit 116 controls the driving unit 120 to forcibly move the tuner positions $T_1$ and $T_2$ to the set positions of the off preset positions (step $S_4$). As described above, the tuner positions $T_1$ and $T_2$, which are suitable for plasma ignition, are selected as the off preset positions. In practice, in a process such as a plasma discharge in which the discharge is started when exceeding a certain threshold, it is meaningless to perform the tuning for preventing the reflection in a state where the discharge is not started. There is an optimal tuner position for the plasma ignition in each process. Such an optimal position is generally determined through the test.

The forcible movement of the tuner positions $T_1$ and $T_2$ to the off preset position is performed within a predetermined period of time. Thereafter, the microwave generator 56 is switched ON (step $S_5$). Next, the set time of the off preset timer is counted and the plasma is ignited (steps $S_6$, $S_7$). After the plasma ignition is completed, the matching control unit 116 forcibly moves the tuner positions $T_1$ and $T_2$ from the off preset positions to the set positions of the on preset positions (step $S_8$). Next, the set time of the on preset timer is counted and the plasma is stabilized (steps $S_9$ and $S_{10}$). After the plasma is stabilized, the matching operation is started.

When the on preset enable/disable is set to "disable (Di)", the operations of forcibly moving the tuner positions $T_1$ and $T_2$ to the on preset positions (steps $S_8$ to $S_{10}$) are omitted and the matching operation is started after the set time of the off preset timer is counted.

The control sequence shown in FIG. 6B is used for consecutively etching a plurality of layers (thin films) while maintaining a plasma in an etching process using a multi-layer resist method, for example. In this case, if interrupt for switching the process condition occurs, the matching control unit 116 checks whether or not the preset No. has been changed (step $S_{11}$). When the preset No. has not been changed, the set value group included in the current preset No. is used again (step $S_{12}$). When the preset No. has been changed, a set value group included in a new preset No. is newly set (step $S_{13}$). Next, the matching control unit 116 controls the driving unit 120 to forcibly move the tuner positions $T_1$ and $T_2$ from the positions near the target positions, which have been maintained, to the set positions of the on preset positions (step $S_{14}$). Then, the set time of the on preset timer is counted and the plasma is stabilized (steps $S_{15}$ and $S_{16}$). After the plasma is stabilized, a new matching operation is started under the changed process conditions.

Referring to FIG. 7, when the matching operation is started, the matching control unit 116 controls the driving unit 120 to forcibly move the tuner positions $T_1$ and $T_2$ from the on preset positions or the off preset positions to the target positions $ST_1$ and $ST_2$ (step $S_{21}$). In this case, the moving distances of the tuner positions $T_1$ and $T_2$ correspond to differences between the on preset positions (predetermined start positions) (or the off preset positions (another predetermined start positions)) and the target positions $ST_1$ and $ST_2$ (set positions), respectively. That is, the moving distances of the tuner positions $T_1$ and $T_2$ are the reliably determined value in the matching control unit 116. Therefore, the tuner positions $T_1$ and $T_2$ can be moved consecutively in one direction at a high speed, i.e., within a short period of time, to the vicinity of the target positions $ST_1$ and $ST_2$ by the driving unit 120. During this time, the matching control unit 116 may ignore the value (the measurement $\Gamma_M$) of the reflection coefficient $\Gamma$ that is monitored or measured by the probe type sensor 122.

When the movement of the tuner positions $T_1$ and $T_2$ to the target positions $ST_1$ and $ST_2$ by the driving unit 120 is completed (step $S_{22}$), the matching control unit 116 conditionally performs the tuning of the feedback control by using the measurement $\Gamma_M$ of the reflection coefficient $\Gamma$ which is obtained from the reflection coefficient measuring unit 114 (steps $S_{23}$ to $S_{27}$).

More specifically, the matching control unit 116 reads out the measurement $\Gamma_M$ of the reflection coefficient $\Gamma$ (step $S_{23}$ and $S_{24}$) and checks or examines on the $\Gamma$ chart whether or not $\Gamma_M$ falls within the inner neighboring range $\Gamma_{th}$ (step $S_{25}$). In other words, even when the required plasma process is repeatedly performed under the same process condition, the state of the load 112 (especially the plasma) may not be the same and slightly different result may be obtained. Further, the positioning of the driving unit 120 may have an error. Therefore, even though the tuner positions $T_1$ and $T_2$ are reliably moved to the vicinity of the target positions $ST_1$ and $ST_2$, the measurement $\Gamma_M$ of the reflection coefficient $\Gamma$ may not coincide with or be close to the target value $\Gamma_{in}$.

When it is determined in the examination (step $S_{25}$) that the measurement of the reflection coefficient $\Gamma$ is not within the inner neighboring range $\Gamma_{th}$, the matching control unit 116 controls the tuner positions $T_1$ and $T_2$ such that the difference or the error between $\Gamma_M$ and $\Gamma_{in}$ becomes close to zero (step $S_{26}$). In this manner, the tuner positions $T_1$ and $T_2$ are variably controlled by the feedback control until $\Gamma_M$ falls within $\Gamma_{th}$ (steps $S_{23}$ to $S_{26}$, $S_{27}$ to $S_{23}$ . . . ). When it is determined that $\Gamma_M$ falls within $\Gamma_{th}$, the matching control unit 116 completes the matching operation (step $S_{28}$).

Referring to FIG. 8, even after the completion of the matching, the matching control unit 116 conditionally performs variable control of the tuner positions $T_1$ and $T_2$ in order to maintain the matching state in the state set by the above matching operation. In other words, after the measurement $\Gamma_M$ of the reflection coefficient falls within the inner neighboring range $\Gamma_{th}$, the matching control unit 116 checks or examines whether or not the measurement $\Gamma_M$ falls within the outer neighboring range by monitoring the measurement $\Gamma_M$ (steps $S_{31}$ to $S_{33}$). When $\Gamma_M$ falls outside $\Gamma_h$, the tuner positions $T_1$ and $T_2$ are variably controlled until $\Gamma_M$ falls within the inner neighboring range $\Gamma_{th}$ (steps $S_{34}$ to $S_{37}$, $S_{38}$ to $S_{34}$ . . . ).

The reason that the outer neighboring range is used instead of the inner neighboring range as the threshold value for executing or restarting the variable control of the tuner positions $T_1$ and $T_2$ after the completion of the matching operation is because the stability of the plasma can be maintained in that case, as will be described later.

In the conventional matching operation, with respect to certain plasma processes, the same matching operation targeting merely the origin (0, 0) on the $\Gamma$ chart is carried out. In contrast, in the matching operation of the embodiment as described above, the target value $\Gamma_{in}$ suitable for suppression of hunting of the plasma emission is set with respect to a required plasma process and the measurement $\Gamma_M$ of the reflection coefficient $\Gamma$ is controlled to be converged in a certain range $\Gamma_{th}$ near the target value $\Gamma_{in}$.

<Selection of the Matching Target Point in the Embodiment (Theory)>

Figure 9:
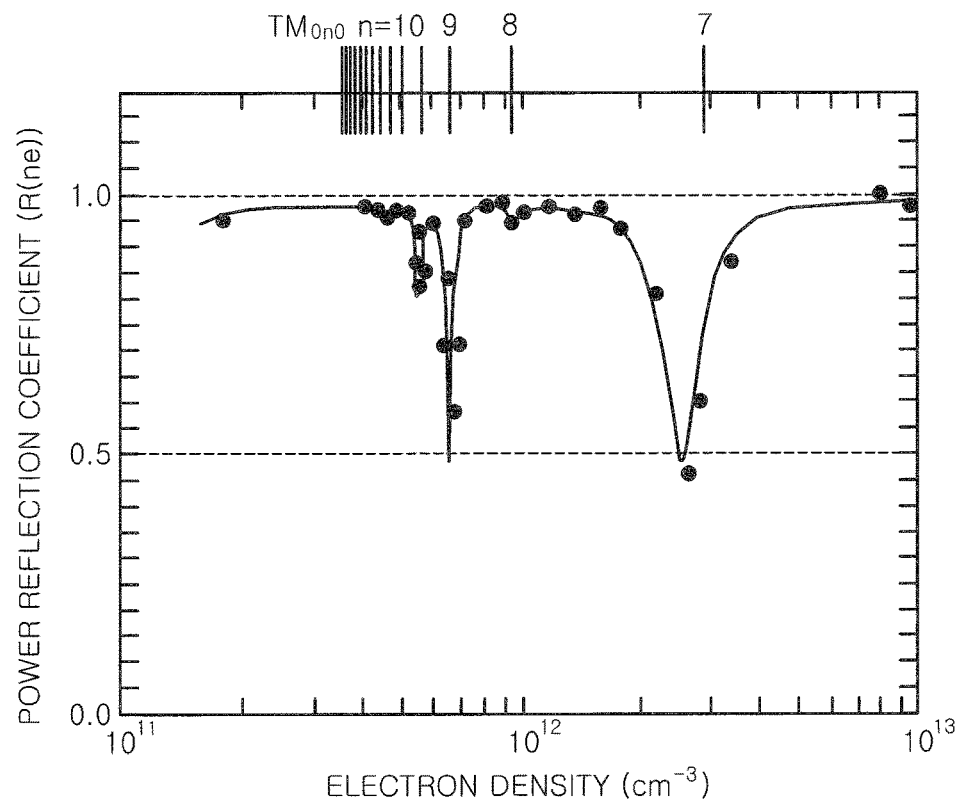
FIG. 9 is a graph showing a relation between an electron density and a power reflection coefficient in a simulation of a surface wave plasma.
Figure 10:
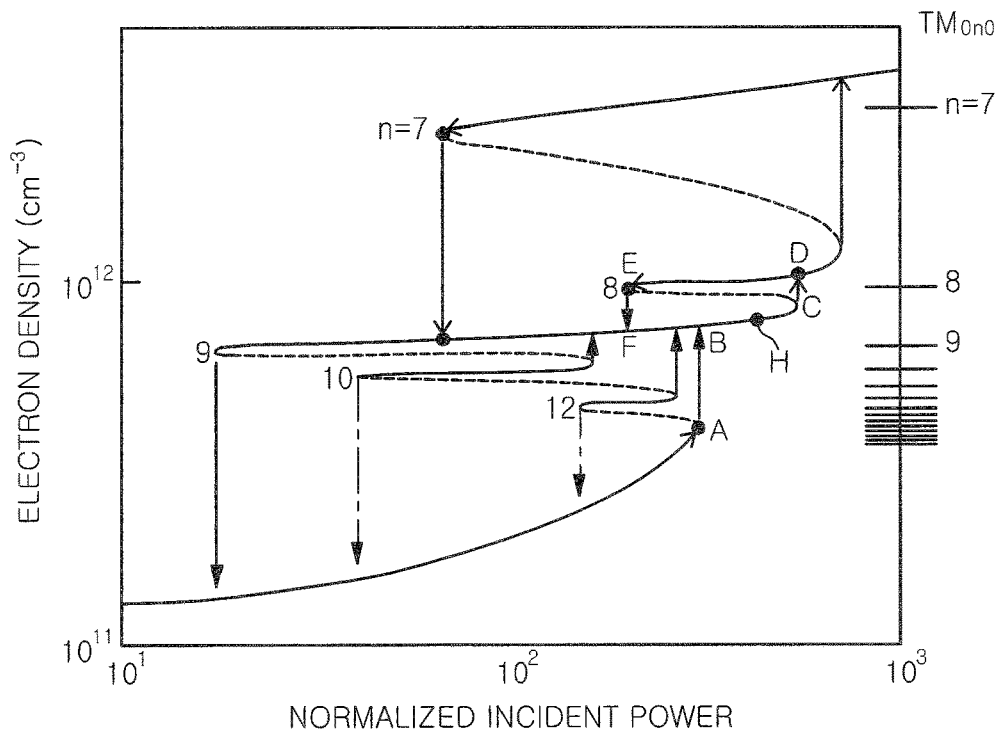
FIG. 10 is a graph showing relation between an electron density and an incident power of a two-dimensional planar microwave plasma in the simulation of the surface wave plasma.

A theoretical basis for selecting the matching target point in the embodiment will be described with reference to FIGS. 9 and 10. The graphs shown in FIGS. 9 and 10 are extracted from "Chapter 4. Modeling and Simulation for Plasma Generation" ("Microwave Plasma Technology" by Institute of Electrical Engineers and Committee for Research of Microwave Plasma, OHMSHA, Japan).

FIG. 9 is a graph showing a relationship between an electron density (plasma density) and a power reflection coefficient in simulation of surface wave plasma. In FIG. 9, a vertical axis represents a power reflection coefficient $R(Ne)(=|\Gamma|^2)$, and a horizontal axis on the lower side of the graph represents an electron density (cm$^{-3}$). In a horizontal axis on the upper side of the graph, a discontinuous value of the electron density, which is permitted in the microwave discharge, is made to correspond to a standing wave mode (TM mode). A solid line in FIG. 9 indicates an analysis result, and multiple dots distributed on the solid line indicate a finite difference time domain method (FDTD) simulation.

As can be seen from FIG. 9, the power reflection coefficient has a large variation in a plurality of standing wave modes (TM modes) permitted in the plasma generated by the microwave discharge. For example, in $TM_{0n0}$ modes of n=7 and n=9, the power reflection coefficient is reduced to about 0.5 and, in a $TM_{0n0}$ modes of n=8, the power reflection coefficient is maintained at about 0.9. In general, the plasma becomes stable in a mode having a low power reflection coefficient and becomes unstable in a mode having a high power reflection coefficient.

FIG. 10 is a graph showing a relationship between an electron density and an incidence power of a two-dimensional planar microwave plasma in simulation of surface wave plasma. In FIG. 10, a vertical axis represents the electron density (cm$^{-3}$) and a horizontal axis represents a normalized incident power. The normalized incident power is a value determined as $P_f$ (traveling wave power)/$P_c$ (constant) and may be referred to as an effective load power. Here, $P_c$ is a constant determined by, for example, a volume of the chamber, a gas type, a pressure and the like. The normalized incident power ($P_f/P_c$) is increased as the traveling wave power $P_f$, which is the incident power, is increased. As for the vertical axis, a vertical axis on the left side of the graph indicates a scale of the electron density and a vertical axis on the right side indicates a standing wave mode (TM mode) made to correspond to a discontinuous electron density value that is permitted.

Referring to the characteristics of FIG. 10, the mechanism of the phenomenon in which the mode jump occurs in the electron density of the plasma generated by the microwave discharge and this leads to the hunting of the plasma emission can be understand as follows.

Figure 11:
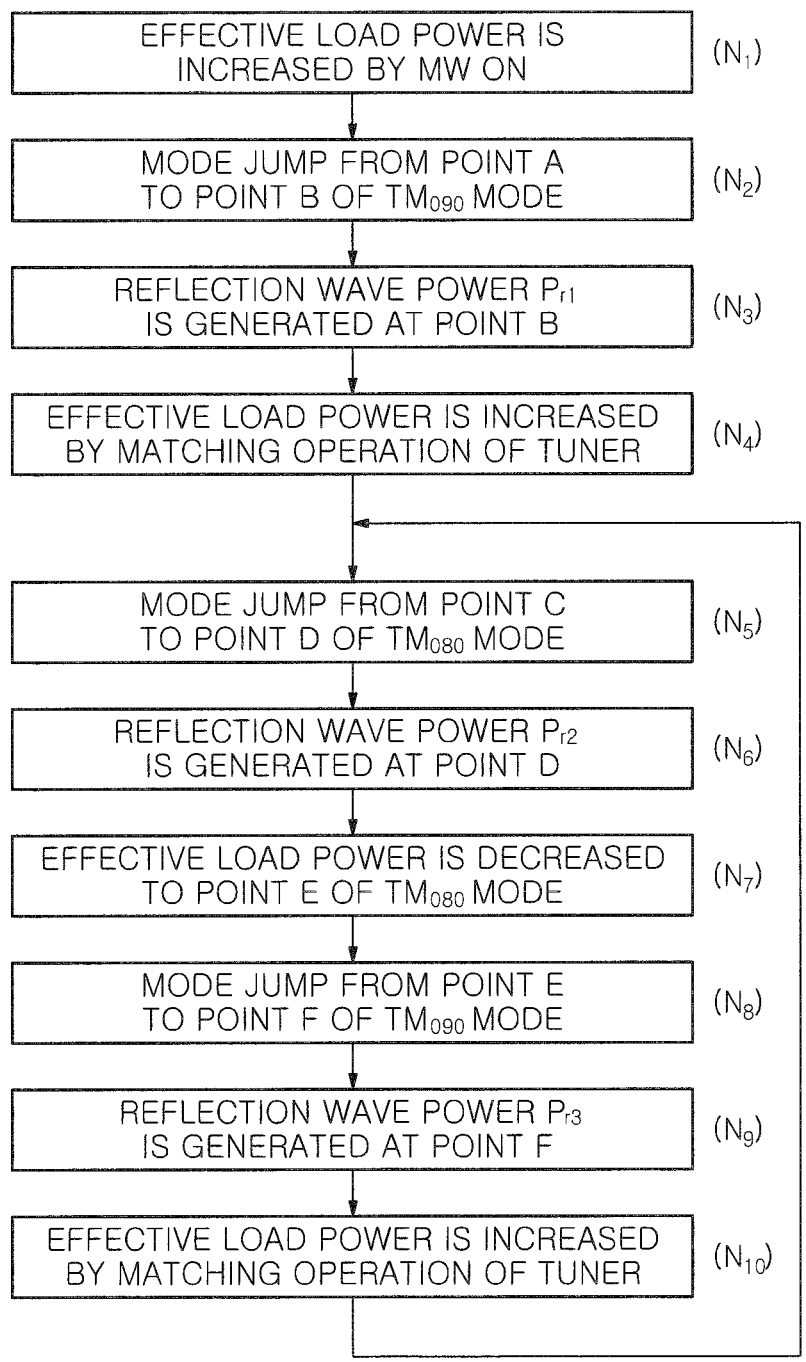
FIG. 11 shows a flow of a typical operation in the case where hunting of plasma emission occurs.

FIG. 11 shows a typical operation flow ($N_1$ to $N_{10}$) in the case where the hunting of the plasma emission occurs. First, when a supply of microwave is started, the effective load power (normalized incident power) is increased ($N_1$) and the electron density is gradually increased under a certain $TM_{0n0}$ mode (n<12). When the effective load power reaches a maximum end point A under the corresponding $TM_{0n0}$ mode, the mode jumps to a point B of a $TM_{090}$ mode ($N_2$). At this time, the electron density is abruptly changed and a large reflection wave power $P_{r1}$ is generated instantly ($N_3$). When the tuner performs the matching operation in response to the generation of this reflection wave power $P_{r1}$, the effective load power is increased under the $TM_{090}$ mode ($N_4$). When the effective load power reaches a maximum end point C under the $TM_{090}$ mode, the mode jumps to a point D of a $TM_{080}$ mode ($N_5$). At this time as well, a large reflection wave power $P_{r2}$ is generated ($N_6$).

The $TM_{080}$ mode has a high power reflection coefficient as described above. Therefore, before the matching operation of the tuner becomes effective, the effective load power is rapidly decreased and moved to a minimum end point E under the $TM_{080}$ mode ($N_7$). Then, the mode jumps from the point E to a point F of the $TM_{090}$ mode ($N_8$). At this time as well, a large reflection wave power $P_{r3}$ is generated ($N_9$). However, the $TM_{090}$ mode is more stable than the $TM_{080}$ mode, so that the matching operation of the tuner becomes effective relatively quickly and the effective load power is increased again ($N_{10}$). In the same manner, the operations ($N_5$ to $N_{10}$→$N_5$ . . . ) of circulating the same loop of points C→D→E→F→C→ . . . are repeated. Whenever the mode jump from the point C to the point D and the mode jump from the point E to the point F occur, a large reflection wave power is generated instantly and the plasma emission becomes weak instantaneously. Accordingly, there occurs the hunting in which the plasma emission becomes intense or weak repeatedly.

In the embodiment, based on the above-described mechanism of the mode jump, the load impedances $Z_{080}(R_{080}+jX_{080})$ and $Z_{090}(R_{090}+jX_{090})$ in two standing wave modes ($TM_{080}$ mode and $TM_{090}$ mode in the example of FIG. 10)

forming the circulation loop of the mode jump are obtained near the end position of the waveguide 58 by using the impedance sensor. In the matching control unit 116 and the setting unit 118 of the microwave automatic matcher 60, an intermediate value $Z_{in}$ between the load impedances $Z_{O80}$ and $Z_{O90}$ is set to a matching target value. $Z_{in}$ is obtained by the following equation (8) and corresponds to the target value $\Gamma_{in}$ of the reflection coefficient:

$$Z_{in}=K*Z_{O80}+(1-K)*Z_{O90} \quad (8)$$

where K is a constant that satisfies a condition of 0<K<1.

Alternatively, in the embodiment, it is possible to obtain the measurements $\Gamma_{O80}$ and $\Gamma_{O90}$ of the reflection coefficient $\Gamma$ by using the reflection coefficient measuring unit 114 of the microwave automatic matcher 60 when the plasma is matched or becomes stable in the $TM_{O80}$ mode and the $TM_{O90}$ mode, and then set an intermediate value of the measurements $\Gamma_{O80M}$ and $\Gamma_{O90M}$ as the target value $\Gamma_{in}$ of the reflection coefficient $\Gamma$. In this case, $\Gamma_{in}$ is obtained by the following equation (9):

$$\Gamma_{in}=k*\Gamma_{O80M}+(1-k)*\Gamma_{O90M} \quad (9)$$

where k is a constant that satisfies a condition of 0<k<1.

When the matching operation in which $Z_{in}$ or $\Gamma_{in}$ is set as the matching target point is performed by the microwave automatic matcher 60, the matching target point is offset from the origin (0,0) on the Smith chart. Thus, an incomplete matching state that permits the reflection corresponding to the offset amount is obtained. However, this leads to suppression of the increase in the effective load power. As a result, the effective load power is not moved to the maximum end point C even under the stable $TM_{O90}$ mode and stays, e.g., at a point H in FIG. 10. Therefore, the mode jump does not occur and the hunting of the plasma emission is suppressed.

As described above, the microwave automatic matcher 60 in the embodiment can considerably shorten a period of time from when the matching operation is started to when the preset matching state (complete matching state or incomplete matching state) is ensured. Accordingly, it is possible to quickly response to the variation of the effective load power or the variation of the plasma, and the stability of the plasma can be further improved even in the case of using the target value $\Gamma_{in}$ of the reflection coefficient $\Gamma$ which is suitable for the suppression of the hunting.

<Selection of the Matching Target Point in the Embodiment (Test)>

The present inventors have examined the test of the plasma process using as the parameter the target value $\Gamma_{in}$ of the reflection coefficient $\Gamma$ by using the plasma processing apparatus of the embodiment. The test result has proved that the target value $\Gamma_{in}$ of the reflection coefficient $\Gamma$ which is suitable for the suppression of the hunting of the plasma emission can be obtained.

FIGS. 12 to 16 show test examples. In this test examples, the set values used for the matching operation of the microwave automatic matcher 60, i.e., the values of the inner neighboring range $\Gamma_{in}$ and the outer neighboring range $\Gamma_h$, were fixed to 0.02 and 0.04, respectively, and five sets of the magnitude $|\Gamma_{in}|$ and the phase $\theta_{in}$, i.e., (0.00, 0°), (0.04, 0°), (0.04, 90°), (0.04, 180°), (0.04, 270°), were selected as the target values $\Gamma_{in}$ of the reflection coefficient $\Gamma$. Then, the plasma was generated under the same process condition, and the traveling wave power $P_f$ and the reflection wave power $P_r$ of the microwave propagating through the waveguide 58 and the tuner positions $T_1$ and $T_2$ in the driving unit 120 were monitored by operating the microwave automatic matcher 60 while using the five target values $\Gamma_{in}$. The test results are shown in FIGS. 12 to 16.

Figure 12:
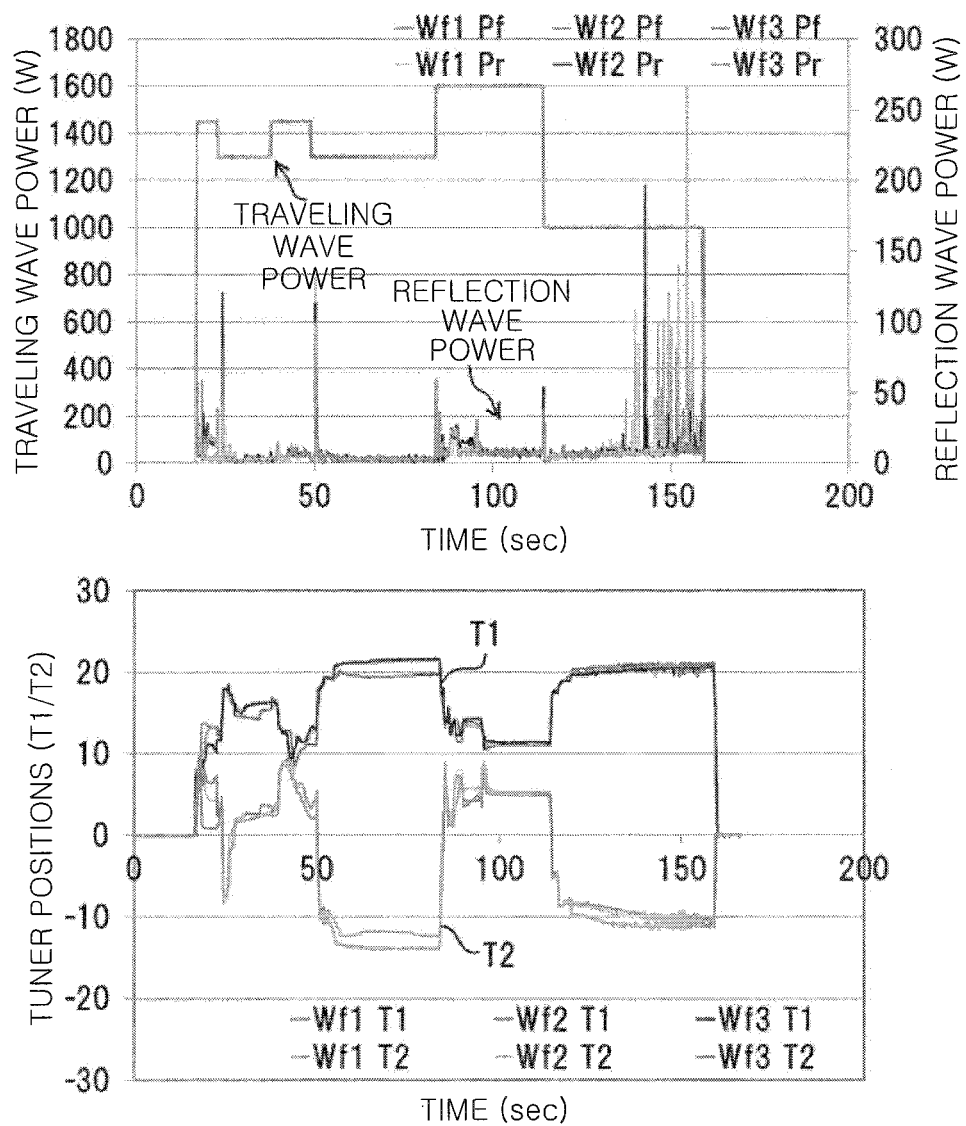
FIG. 12 shows a measurement result of each component in the case where conditions of $|\Gamma_{in}|=0.00$ and $\theta_{in}=0°$ are selected in a plasma process test using a target value $\Gamma_{in}$ of a reflection coefficient Γ as a parameter.
Figure 13:
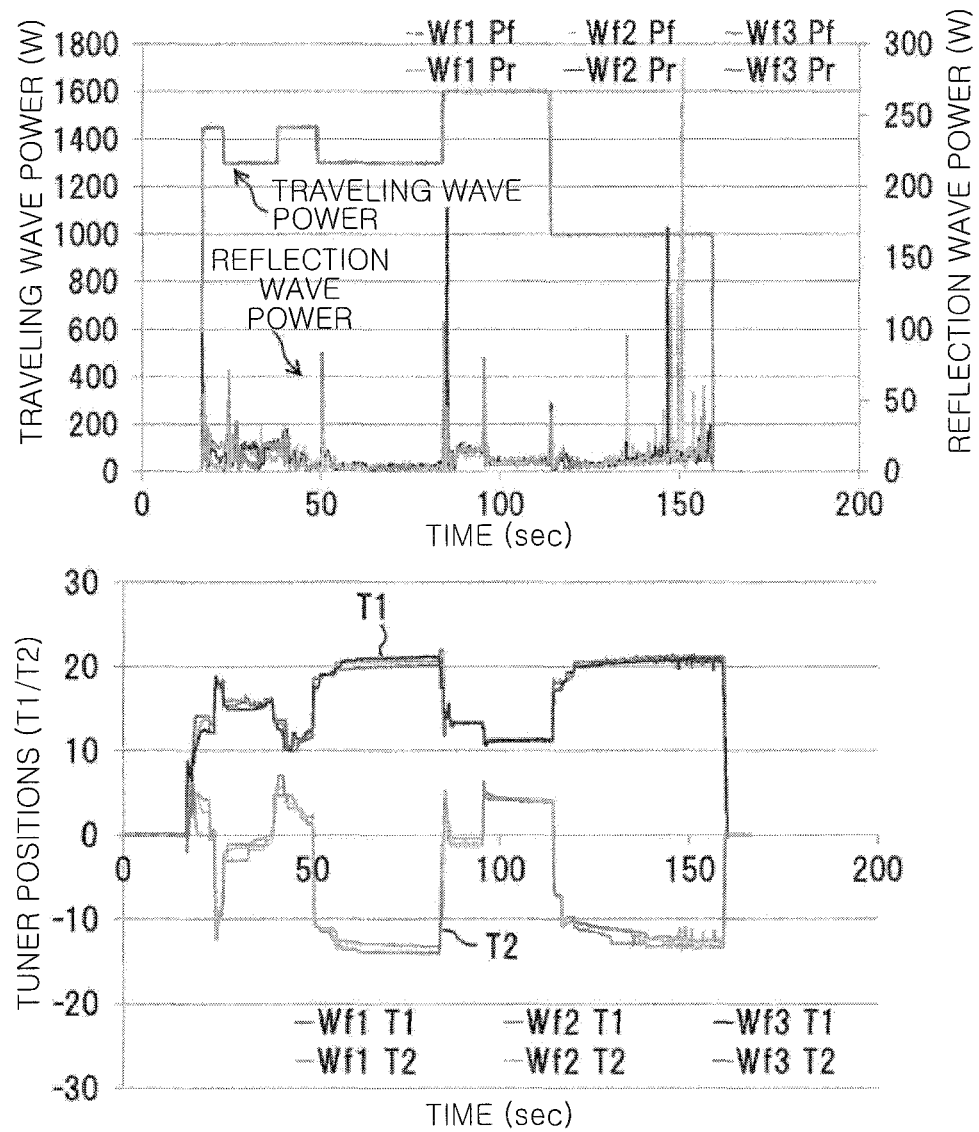
FIG. 13 shows a measurement result of each component in the case where conditions of $|\Gamma_{in}|=0.04$ and $\theta_{in}=0°$ are selected in the plasma process test.
Figure 14:
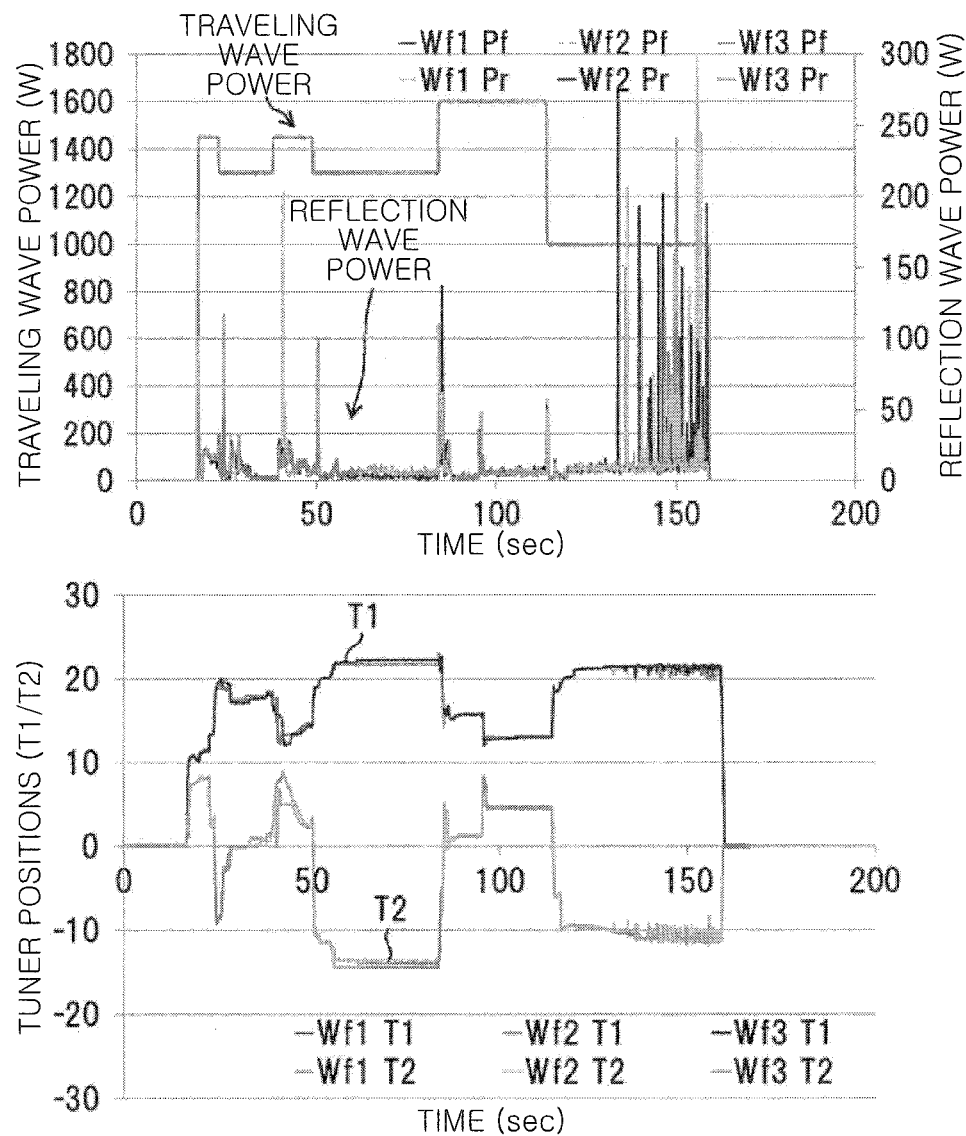
FIG. 14 shows a measurement result of each component in the case where conditions of $|\Gamma_{in}|=0.04$ and $\theta_{in}=90°$ are selected in the plasma process test.

As shown in FIGS. 12 to 14, a large number of pulses of the reflection wave power each having a high peak (generation of hunting) were observed in the case of ($|\Gamma_{in}|$, $\theta_{in}$)= (0.04, 0°) and ($|\Gamma_{in}|$, $\theta_{in}$)=(0.04, 90°) as well as in the case of ($|\Gamma_{in}|$, $\theta_{in}$)=(0.00, 0°). Further, it was also observed that pulsations of the tuner positions $T_1$ and $T_2$ occurred in response to spikes of the reflection wave power.

Figure 15:
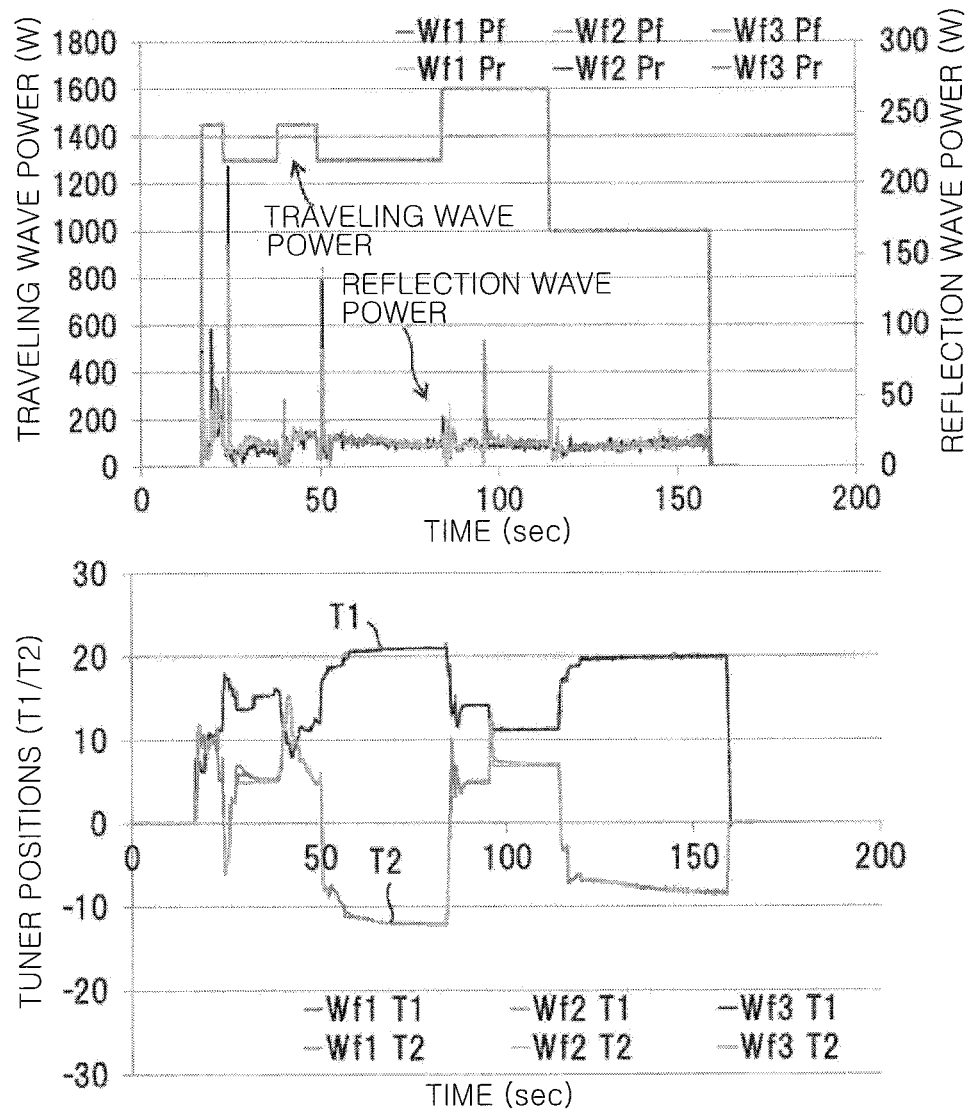
FIG. 15 shows a measurement result of each component in the case where the conditions of $|\Gamma_{in}|=0.04$ and $\theta_{in}=180°$ are selected in the plasma process test.
Figure 16:
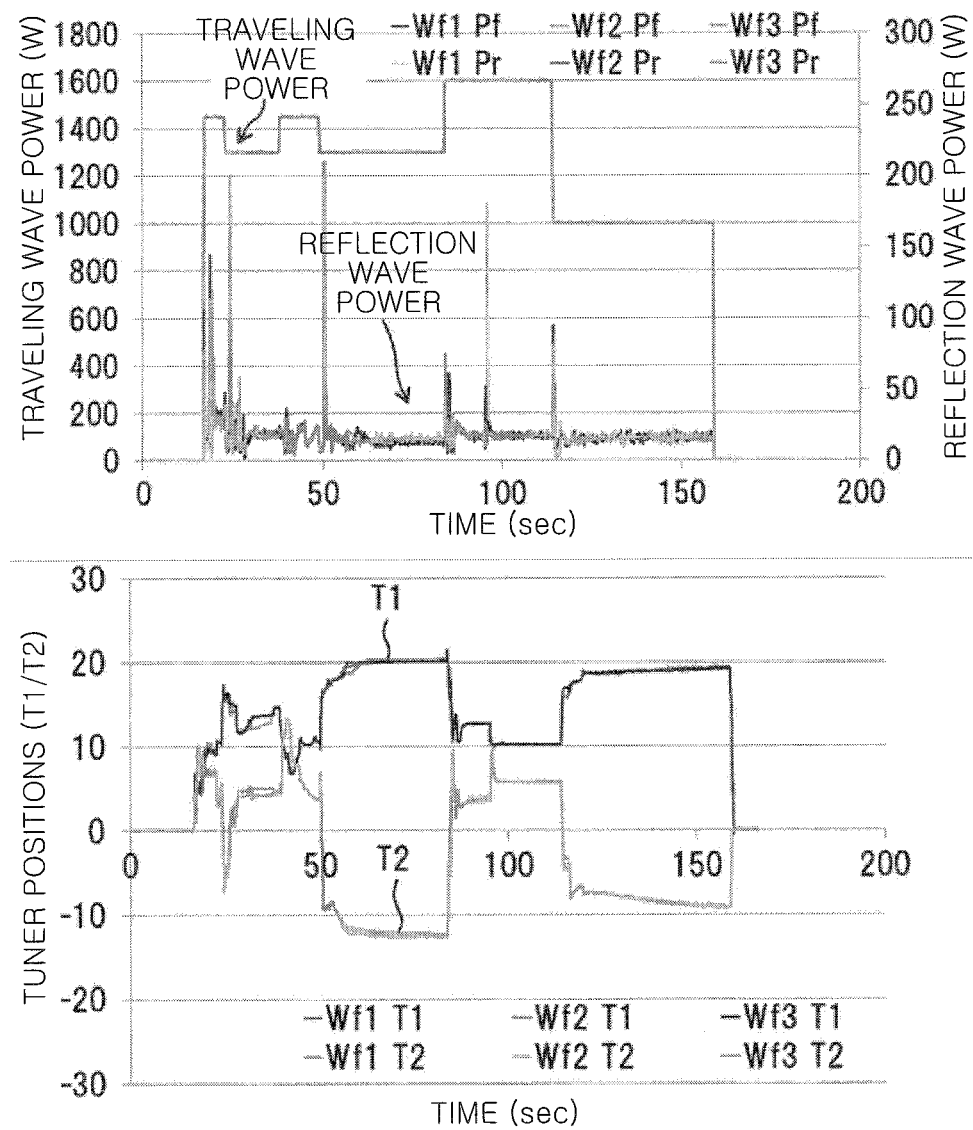
FIG. 16 shows a measurement result of each component in the case where the conditions of $|\Gamma_{in}|=0.04$ and $\theta_{in}=270°$ are selected in the plasma process test.

On the other hand, as shown in FIGS. 15 and 16, in the case of ($|\Gamma_{in}|$, $\theta_{in}$)=(0.04, 180°) and ($|\Gamma_{in}|$, $\theta_{in}$)=(0.04, 270°), spikes of the reflection wave power $P_r$ (generation of hunting) were hardly observed and pulsations of the tuner positions $T_1$ and $T_2$ were also hardly observed. Further, in those cases, it was observed that the reflection wave power $P_r$ was substantially flat and slightly higher than a zero level.

The test result shows that, with respect to the plasma process performed under the corresponding process condition, the hunting of the plasma emission can be reliably suppressed while properly permitting the generation of the reflection wave power by setting the target value $\Gamma_{in}$ of the reflection coefficient $\Gamma$ to the conditions of $|\Gamma_{in}|$=0.04 and $\theta_{in}$=180°~270° in the microwave automatic matcher 60 (the setting unit 118).

<Selection of the Matching Target Point in the Embodiment>

Figure 17:
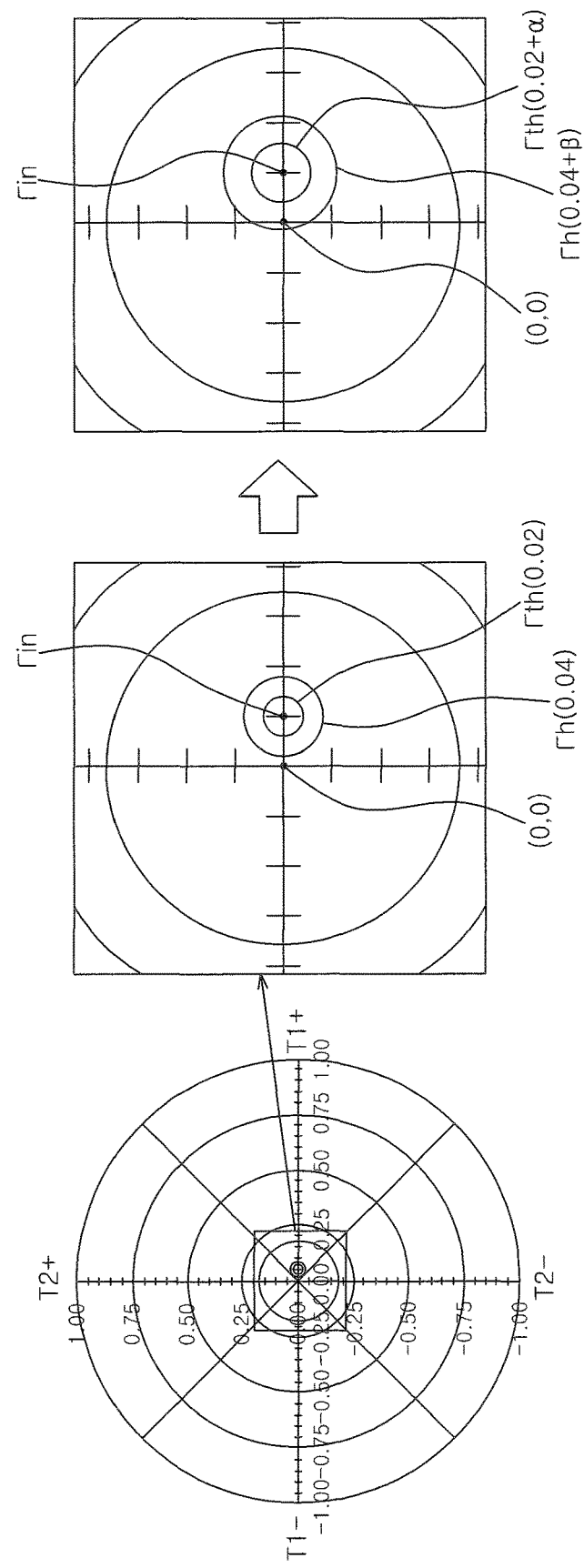
FIG. 17 explains a function of setting a first and a second neighboring range to a variable size in the embodiment.

In the embodiment, the target value $\Gamma_{in}$ of the reflection coefficient $\Gamma$ is set as the parameter used for the matching operation of the microwave automatic matcher 60. Further, the inner (first) neighboring range $\Gamma_{th}$ is set as a threshold for completing the matching operation, and the outer (second) neighboring range $\Gamma_h$ is set as a threshold for stably maintaining the obtained matching state. In this regard, it is significant to select the dimensions (distances) of the neighboring ranges $\Gamma_{th}$ and $\Gamma_h$. In the embodiment, as shown in FIG. 17, the setting unit 118 of the microwave automatic matcher 60 has a function of controlling the set values of the neighboring ranges $\Gamma_{th}$ and $\Gamma_h$ to variable sizes by certain increase/decrease parameters α and β, respectively.

Figure 19:
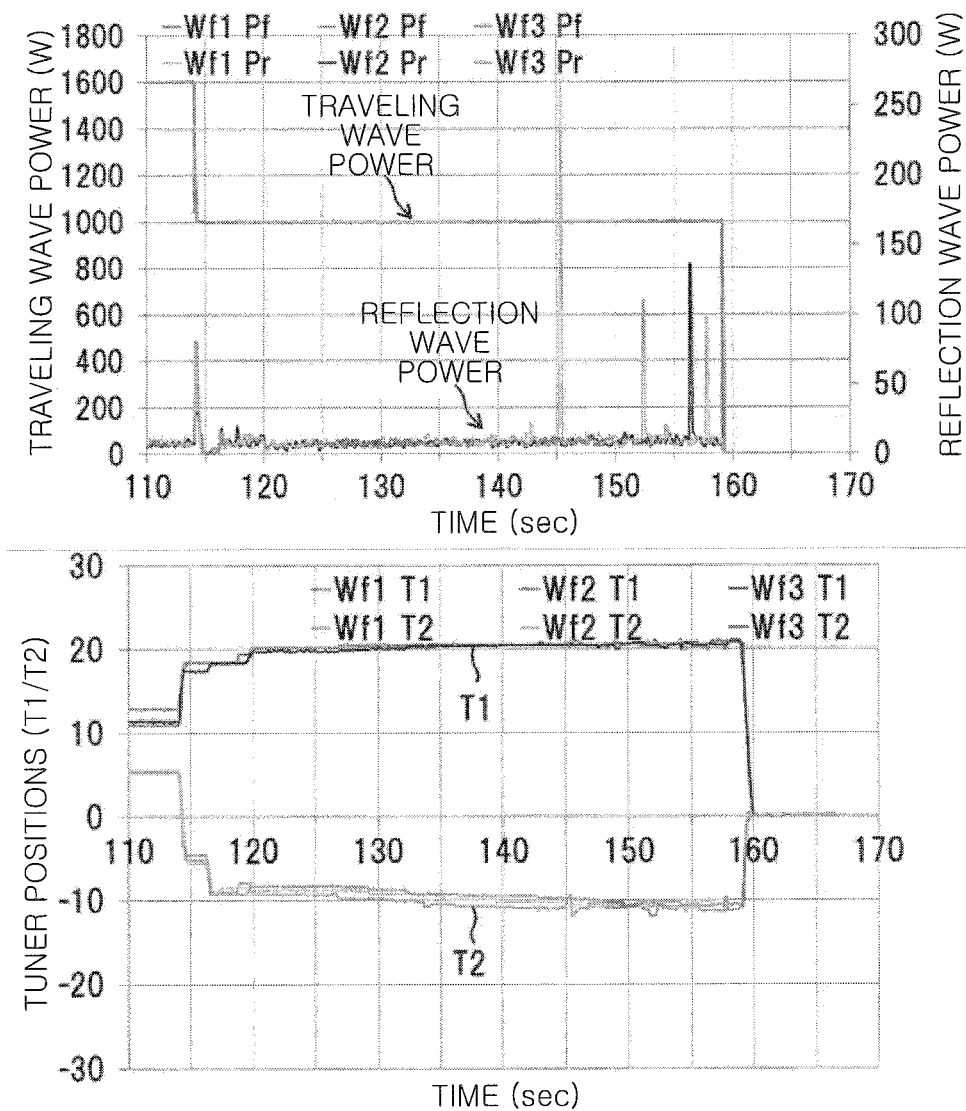
Figure 20:
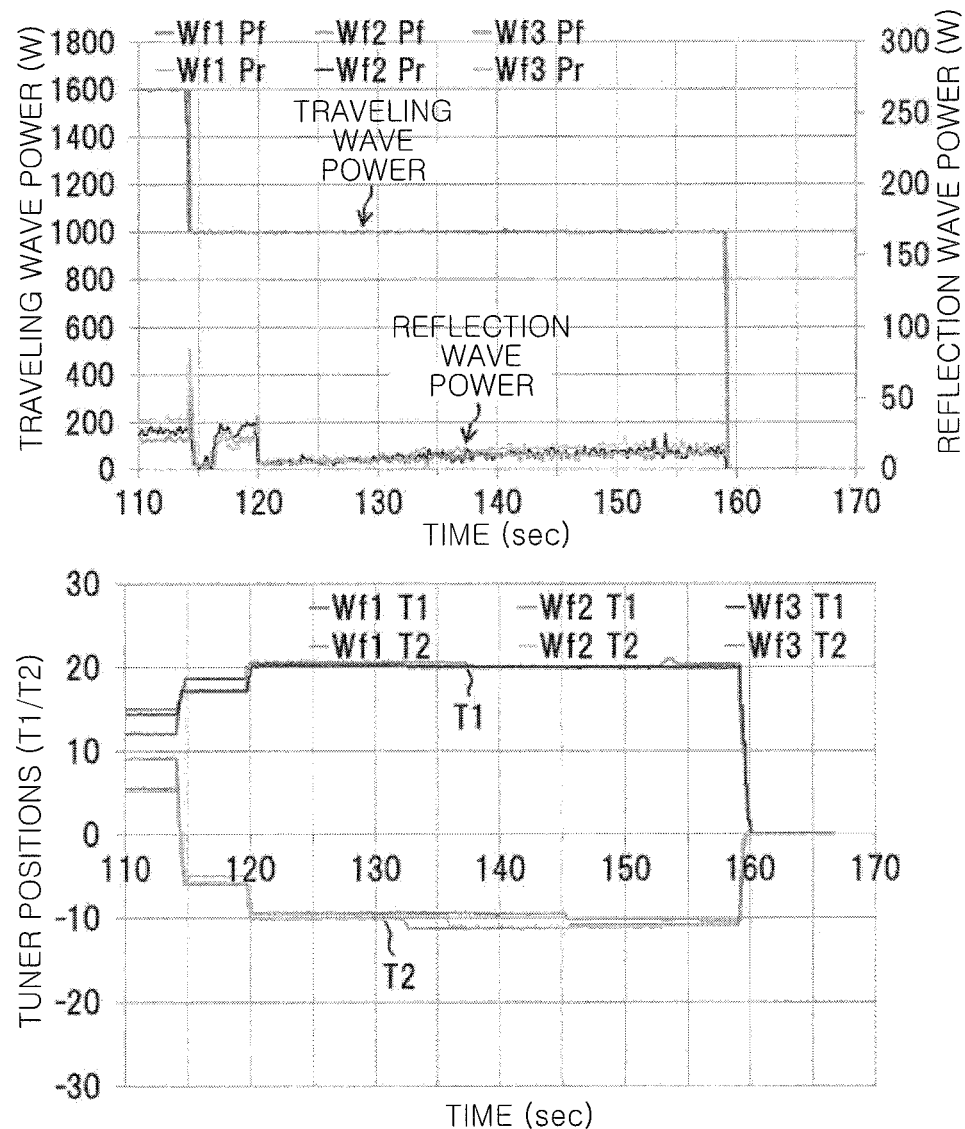

The present inventors have found that it is important to reliably select the set values of the neighboring ranges $\Gamma_{th}$ and $\Gamma_h$ from the above test examples. In the test examples, the target value $\Gamma_{in}$ of the reflection coefficient, i.e., the magnitude $|\Gamma_{in}|$ and the phase $\theta_{in}$, was fixed to (0.00, 0°); the value of the inner neighboring range $\Gamma_{in}$ was fixed to 0.02; and the value of the outer neighboring range $\Gamma_h$ was varied to three values of 0.04, 0.1, and 0.2. Then, the plasma was generated under the same process condition, and the traveling wave power $P_f$ and the reflection wave power $P_r$ of the microwave propagating through the waveguide 58 and the tuner positions $T_1$ and $T_2$ in the driving unit 120 were observed by operating the microwave automatic matcher while using the three values of the outer neighboring range $r_h$. The test result is shown in FIGS. 18 to 20.

Figure 18:
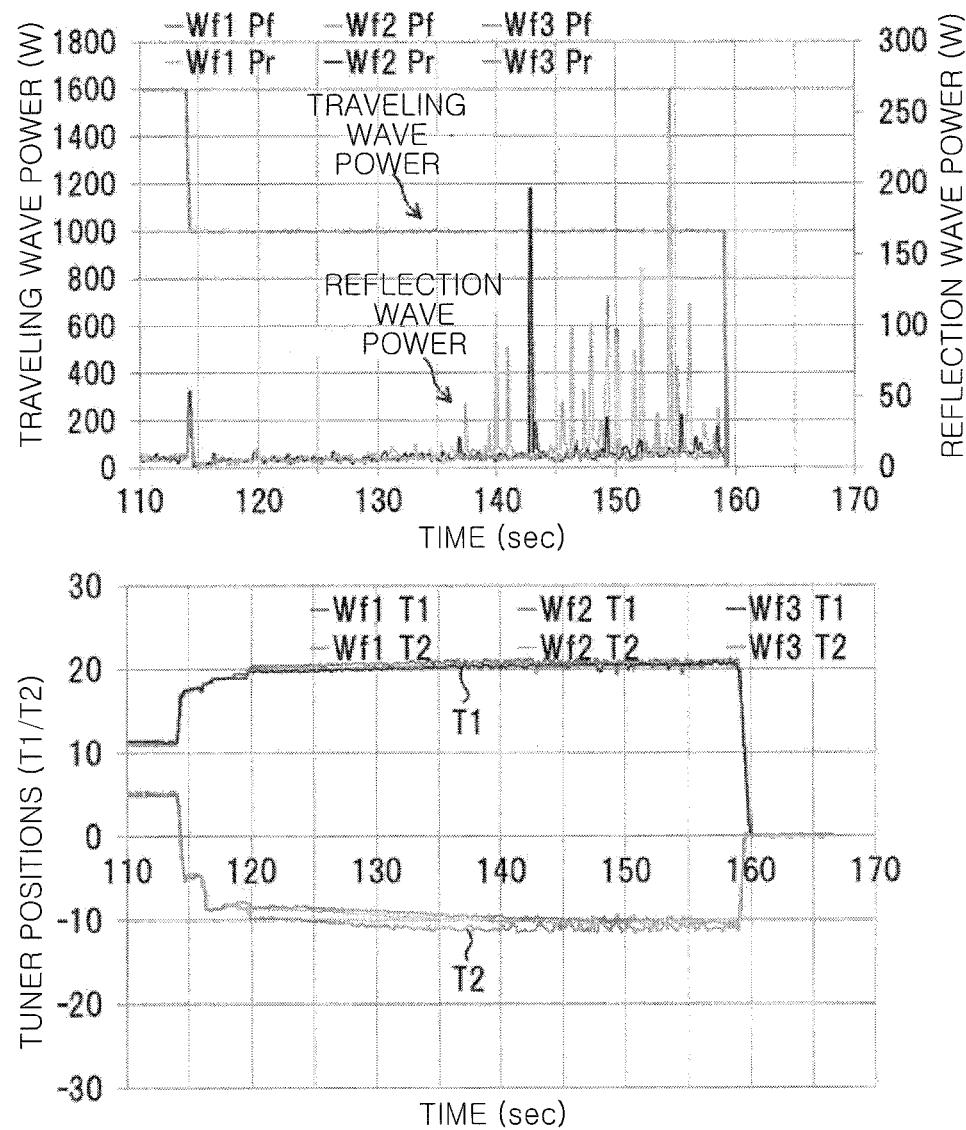
FIGS. 18 to 20 show measurement results obtained from the tests of the plasma process using the size of the neighboring range as a parameter in the embodiment.

As shown in FIG. 18, in the case of $\Gamma_h$=0.04, a large number of spikes of the reflection wave power each having a high peak (generation of hunting) were observed. However, in the case of $\Gamma_h$=0.1, spikes of the reflection wave power (generation of hunting) were considerably decreased as shown in FIG. 19. In the case of $\Gamma_h$=0.2, spikes of the reflection wave power (generation of hunting) were hardly observed as shown in FIG. 20.

<Another Embodiments or Modifications>

In the above embodiment, when the target value $\Gamma_{in}$ ($|\Gamma_{in}|$, $\theta_{in}$) of the reflection coefficient $\Gamma$ is set by the setting unit 118, the values of the tuner positions $T_1$ and $T_2$ corresponding to the target value $\Gamma_{in}$, i.e., the target positions $ST_1$ and $ST_2$, can be automatically obtained from the accumulated information.

In this case, it is not necessary to make the target positions $ST_1$ and $ST_2$ of the tuner positions $T_1$ and $T_2$ correspond to the target value $\Gamma_{in}$ with high accuracy. As described above, in the matching operation, the matching control unit 116 forcibly moves the tuner positions $T_1$ and $T_2$ from the off set position or the on set position (start position) to the target positions $ST_1$ and $ST_2$ and then switch the matching operation to the precise feedback control using the measurement $\Gamma_M$ of the reflection coefficient $\Gamma$. In the operation of moving the tuner positions $T_1$ and $T_2$ from the start position to the target positions $ST_1$ and $ST_2$, a high speed is required. From this, it is allowed to have slight errors of the target positions $ST_1$ and $ST_2$ of the tuner positions $T_1$ and $T_2$. Therefore, it is possible to use default values for converging the reflection coefficient $\Gamma$ to the vicinity of the origin (0, 0) on the $\Gamma$ chart as the set values of the target positions $ST_1$ and $ST_2$ of the tuner positions $T_1$ and $T_2$.

Figure 21:
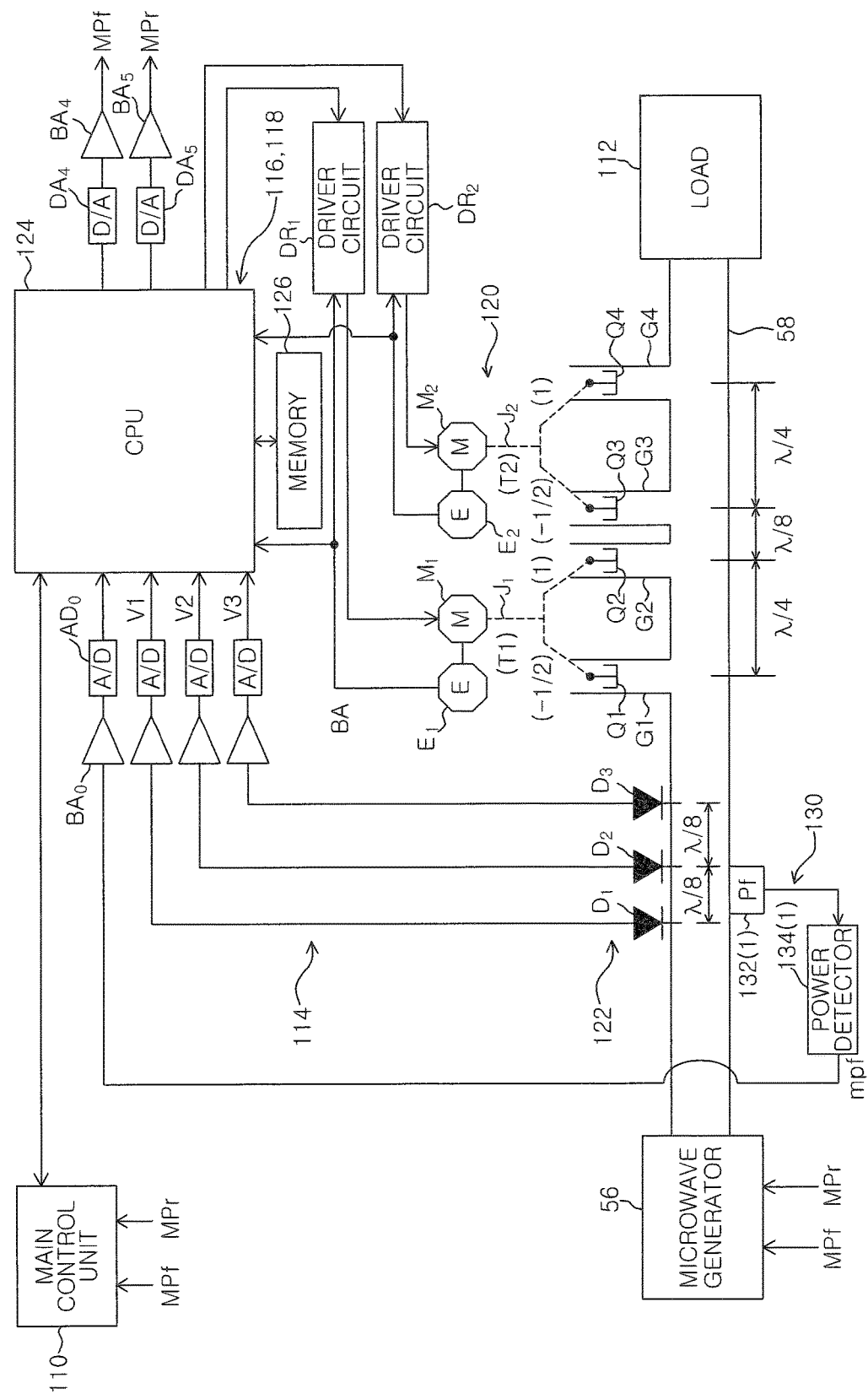
FIG. 21 is a block diagram showing a configuration of a microwave automatic matcher in a modification of the embodiment.

As another modification, a part of the function of the microwave power monitor 130 may be replaced by a signal process of the CPU 124, as shown in FIG. 21. In the modification shown in FIG. 21, a measurement signal $mp_f$ of the traveling wave power obtained by the detector 134(1) of the traveling wave system in the microwave power monitor 130 is inputted to the CPU 124 through the buffer amplifier $BA_0$ and the A/D converter $AD_0$. The CPU 124 generates a measurement signal $MP_f$ of the standard travelling wave power by performing a linear correction on the square-law characteristics of the inputted signal $mp_f$ and also generates a measurement signal $MP_r$ of the reflection wave power by performing an operation expressed by the following equation (10):

$$MP_r = MP_f * |\Gamma_M|^2 \qquad (10)$$

where $|\Gamma_m|$ represents the magnitude of the measurement $\Gamma_M$ of the reflection coefficient $\Gamma$ which is obtained by the reflection coefficient measuring unit 114.

the measurement signal $MP_f$ of the standard traveling wave power and the measurement signal $MP_r$ of the reflection wave power obtained in the CUP 124 are outputted through the D/A converters $DA_4$ and $DA_5$ and the buffer amplifiers $BA_4$ and $BA_5$, transmitted to the main control unit 110 in order to display a monitoring result of the microwave power, and also transmitted to the microwave generator 56 in order to perform the feedback control of the microwave power.

In the modification shown in FIG. 21, the entire components of the reflection wave system and the linearizer of the traveling wave system in the microwave power monitor 130 can be omitted. Further, the sensor output signals $V_1$ to $V_3$ and the measurement $\Gamma_M$ of the reflection coefficient $\Gamma$ obtained by the reflection coefficient measuring unit 114 are used for the feedback control of the automatic matching and also used for the calculation of the measurement of the reflection wave power. Accordingly, a highly accurate correspondence relationship between a state in which the matching is completed or maintained and a state in which the monitor measurement of the reflection wave power is zero or close to zero is obtained.

In the above embodiments, the microwave automatic matcher 60 of the 4E tuner is described as an example. The microwave automatic matcher 60 may be configured as a 3E tuner, or may be configured as an EH tuner or a stub tuner. The function or the configuration of each component of the microwave automatic matcher 60, such as the matching control unit 116, the setting unit 118, the driving unit 140 or the like, may be appropriately modified in accordance with a tuner type to be employed.

While the disclosure has been shown and described with respect to the embodiments, it will be understood by those skilled in the art that various changes and modifications may be made without departing from the scope of the disclosure as defined in the following claims.

What is claimed:

1. A microwave automatic matcher attached to a waveguide which constitutes at least a part of a microwave transmission line connecting a microwave generator with a microwave discharge type plasma processing apparatus, the microwave automatic matcher comprising:
a movable body configured to be movable in the waveguide or in a branch waveguide connected to the waveguide;
a driving unit configured to move the movable body within a specific range;
a matching control unit configured to control a position of the movable body by using the driving unit to perform an impedance matching between the microwave generator and a load;
a reflection coefficient measuring unit configured to obtain a measurement of a reflection coefficient by detecting a standing wave of microwave propagating through the waveguide at a position closer to the microwave generator than the movable body; and
a setting unit configured, with respect to a plasma process, to set a target value of the reflection coefficient and a first neighboring range surrounding the target value of the reflection coefficient and set a position of the movable body which corresponds to the target value of the reflection coefficient as a target position,
wherein the matching control unit consecutively moves the movable body from a start position in one direction by a distance of a difference between the start position and the target position in a matching operation carried out for the plasma process and then variably controls the position of the movable body until the measurement of the reflection coefficient obtained by the reflection coefficient measuring unit falls within the first neighboring range by monitoring the measurement of the reflection coefficient.

2. The microwave automatic matcher of claim 1, wherein the target value of the reflection coefficient is selected such that hunting of emission of a plasma generated by the plasma generating apparatus is suppressed.

3. The microwave automatic matcher of claim 1, wherein the target value of the reflection coefficient is determined based on a test of the plasma process which is performed while using as a parameter the target value of the reflection coefficient in the plasma processing apparatus.

4. The microwave automatic matcher of claim 1, wherein the target value of the reflection coefficient is an intermediate value between a first reflection coefficient and a second reflection coefficient respectively obtained in a predetermined first mode and a predetermined second mode among a plurality of modes in which a discontinuous electron density is permitted in a plasma generated by the plasma processing apparatus.

5. The microwave automatic matcher of claim 1, wherein the matching control unit sets the first neighboring range to a variable size.

6. The microwave automatic matcher of claim 1, wherein the setting unit further sets a second neighboring range surrounding the first neighboring range in the plasma process, the matching control unit monitors the measurement of the reflection coefficient obtained by the reflection coefficient measuring unit even after the measurement of the reflection coefficient falls within the first neighboring range in the matching operation, and when the measurement of the reflection coefficient falls outside the second neighboring range, the matching control unit variably controls the position of the movable body until the measurement of the reflection coefficient falls within the first neighboring range again.

7. The microwave automatic matcher of claim 6, wherein the matching control unit sets the second neighboring range to a variable size.

8. The microwave automatic matcher of claim 1, wherein the start position is a position of the movable body which is suitable for ignition of a plasma in the plasma processing apparatus.

9. The microwave automatic matcher of claim 1, wherein the start position is a position of the movable body which is suitable for stabilization of a plasma immediately after ignition in the plasma processing apparatus.

10. The microwave automatic matcher of claim 1, wherein the start position is a position of the movable body which is suitable for stabilization of a plasma when a plasma generation is interrupted to change a process condition during the plasma generation in the plasma processing apparatus.

11. The microwave automatic matcher of claim 8, wherein the setting unit sets the start position, and the matching control unit forcibly moves the position of the movable body to the start position before the matching operation is started.

12. The microwave automatic matcher of claim 9, wherein the setting unit sets the start position, and the matching control unit forcibly moves the position of the movable body to the start position before the matching operation is started.

13. The microwave automatic matcher of claim 10, wherein the setting unit sets the start position, and the matching control unit forcibly moves the position of the movable body to the start position before the matching operation is started.

14. The microwave automatic matcher of claim 8, wherein the start position is determined by a test of the plasma process which is performed while using the start position as a parameter by the plasma processing apparatus or by another plasma processing apparatus of the same type.

15. The microwave automatic matcher of claim 9, wherein the start position is determined by a test of the required plasma process which is performed while using the start position as a parameter by the plasma processing apparatus or by another plasma processing apparatus of the same type.

16. The microwave automatic matcher of claim 10, wherein the start position is determined by a test of the required plasma process which is performed while using the start position as a parameter by the plasma processing apparatus or by another plasma processing apparatus of the same type.

17. The microwave automatic matcher of claim 1, wherein a multiple number of branch waveguides are provided in a predetermined layout at one side surface of a plurality of side surfaces of the waveguide, a movable short-circuit body as the movable body is inserted into each of the branch waveguides to be movable in an axial direction of the corresponding branch waveguide, and the driving unit includes a single motor or a plurality of motors configured to individually move the movable short-circuit bodies or simultaneously move the movable short-circuit bodies.

18. A plasma processing apparatus comprising:

an evacuable process chamber including a dielectric window;

a stage configured to support a target object to be processed in the process chamber;

a process gas supply unit configured to supply a predetermined process gas into the process chamber;

an antenna, having a single slot or a plurality of slots for radiating microwave for plasma generation into the process chamber, provided above the dielectric window;

a microwave generator configured to generate the microwave;

a microwave transmission line configured to transmit the microwave generated by the microwave generator to the antenna;

a waveguide which constitutes at least a part of the microwave transmission line; and the microwave automatic matcher described in claim 1, which is attached to the waveguide.

* * * * *